(12) United States Patent
Cheng et al.

(10) Patent No.: US 10,446,504 B2
(45) Date of Patent: Oct. 15, 2019

(54) CHIP PACKAGE AND METHOD FOR FORMING THE SAME

(71) Applicant: XINTEC INC., Taoyuan (TW)

(72) Inventors: Chia-Ming Cheng, New Taipei (TW); Po-Han Lee, Taipei (TW); Wei-Chung Yang, Taoyuan (TW); Kuan-Jung Wu, Taoyuan (TW); Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/980,577

(22) Filed: May 15, 2018

(65) Prior Publication Data

US 2018/0337142 A1 Nov. 22, 2018

Related U.S. Application Data

(60) Provisional application No. 62/508,028, filed on May 18, 2017.

(51) Int. Cl.

| H01L 23/52 | (2006.01) |
|---|---|
| H01L 23/00 | (2006.01) |
| H01L 25/16 | (2006.01) |
| H01L 21/56 | (2006.01) |
| H01L 23/31 | (2006.01) |
| H01L 23/04 | (2006.01) |
| H01L 27/146 | (2006.01) |

(52) U.S. Cl.
CPC ............ *H01L 23/562* (2013.01); *H01L 21/56* (2013.01); *H01L 21/561* (2013.01); *H01L 23/04* (2013.01); *H01L 23/3107* (2013.01); *H01L 23/3128* (2013.01); *H01L 24/09* (2013.01); *H01L 24/17* (2013.01); *H01L 25/167* (2013.01); *H01L 27/14643* (2013.01); H01L 2224/02373 (2013.01)

(58) Field of Classification Search
CPC ... H01L 21/561; H01L 21/56; H01L 23/3128; H01L 23/3107; H01L 23/04; H01L 23/562; H01L 24/09; H01L 24/17; H01L 25/167; H01L 27/24643
USPC ........................................................ 257/777
See application file for complete search history.

(56) References Cited

U.S. PATENT DOCUMENTS

| 7,141,884 B2 * | 11/2006 | Kojima | ............... | H01L 23/3121 |
| | | | | 257/778 |
| 9,553,162 B2 * | 1/2017 | Strothmann | ............ | H01L 24/20 |
| 9,691,708 B1 * | 6/2017 | Huang | ................ | H01L 23/5389 |
| 2017/0271248 A1 * | 9/2017 | Chen | ................... | H01L 25/0657 |

* cited by examiner

*Primary Examiner* — Luan C Thai
(74) *Attorney, Agent, or Firm* — Liu & Liu

(57) ABSTRACT

A chip package is provided. A first bonding structure is disposed on a first redistribution layer (RDL). A first chip includes a sensing region and a conductive pad that are adjacent to an active surface. The first chip is bonded onto the first RDL through the first bonding structure. The first bonding structure is disposed between the conductive pad and the first RDL. A molding layer covers the first RDL and surrounds the first chip. A second RDL is disposed on the molding layer and the first chip and is electrically connected to the first RDL. A second chip is stacked on a non-active surface of the first chip and is electrically connected to the first chip through the second RDL, the first RDL, and the first bonding structure. A method of forming the chip package is also provided.

20 Claims, 23 Drawing Sheets

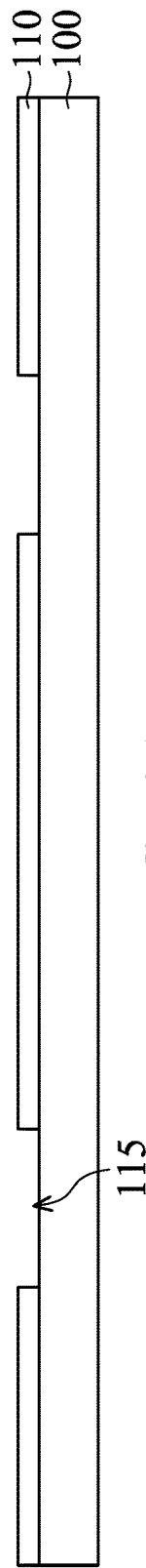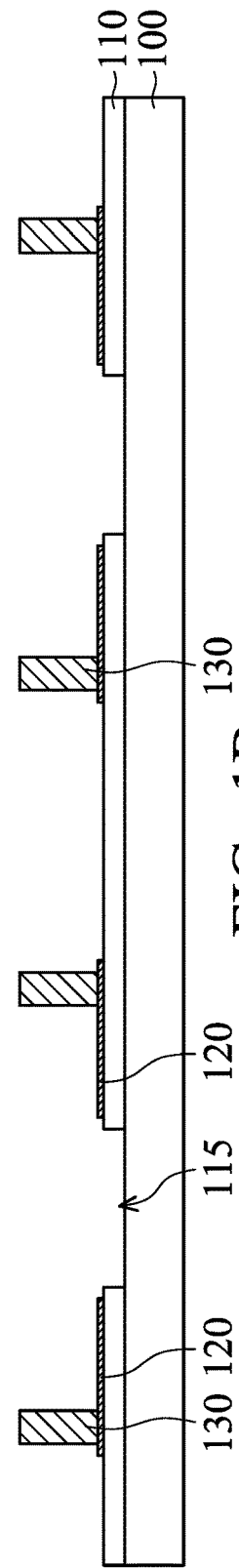

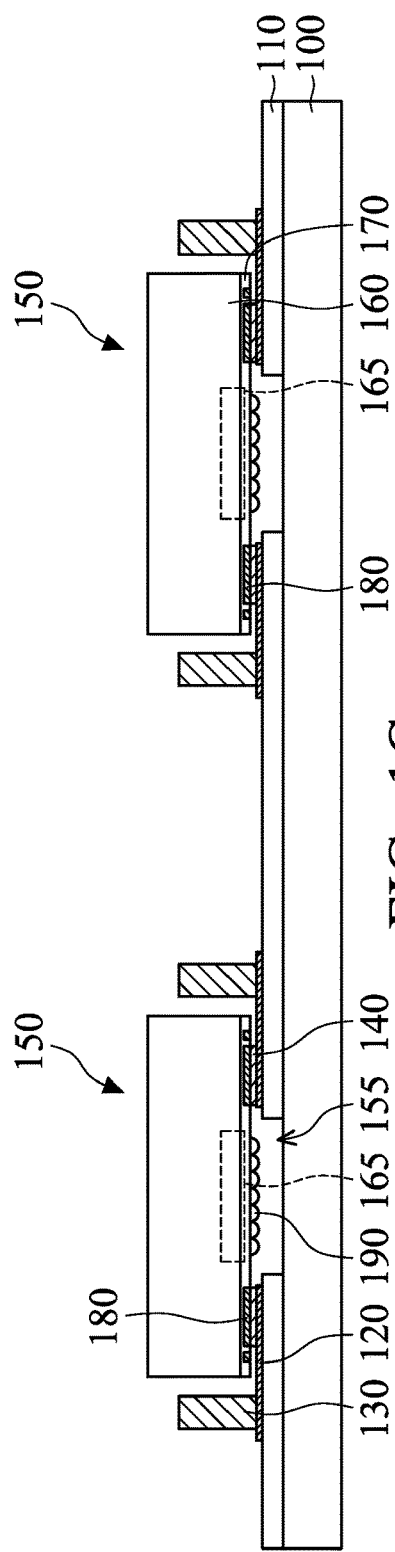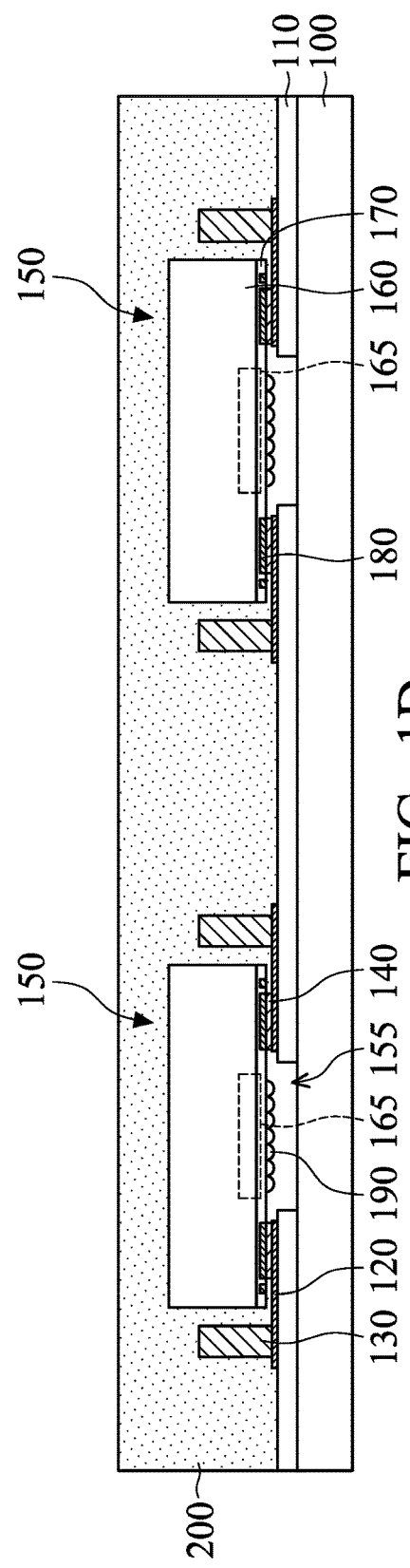

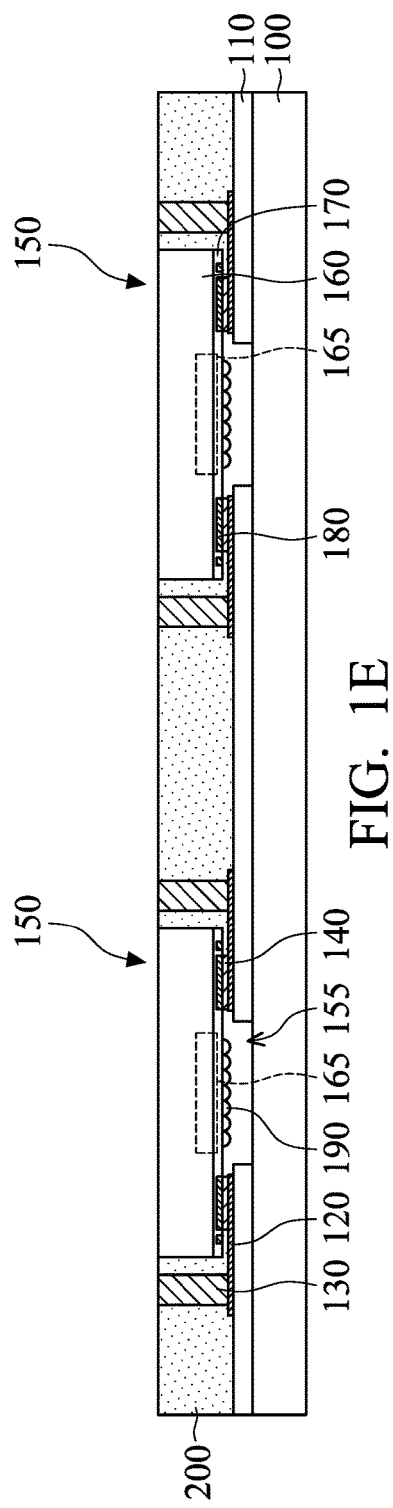
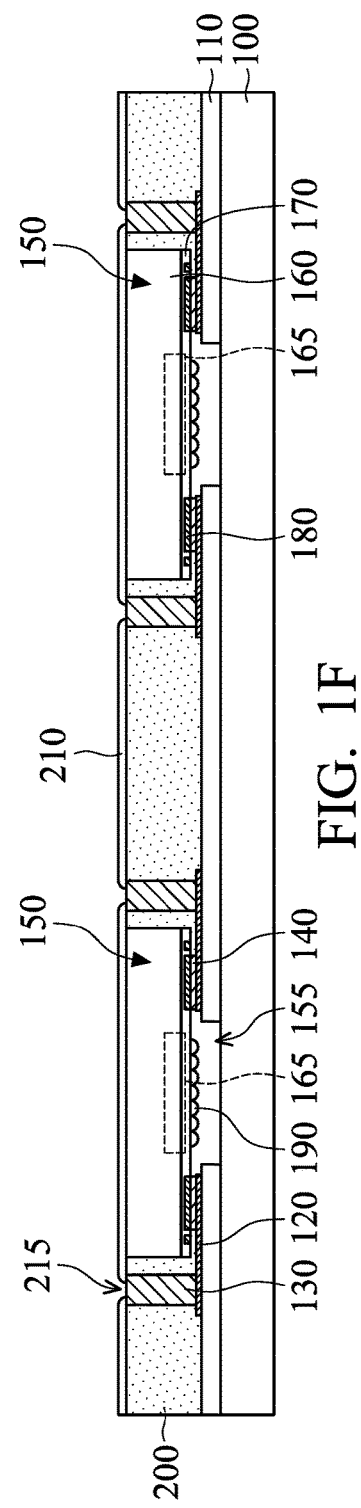
FIG. 1E
FIG. 1F

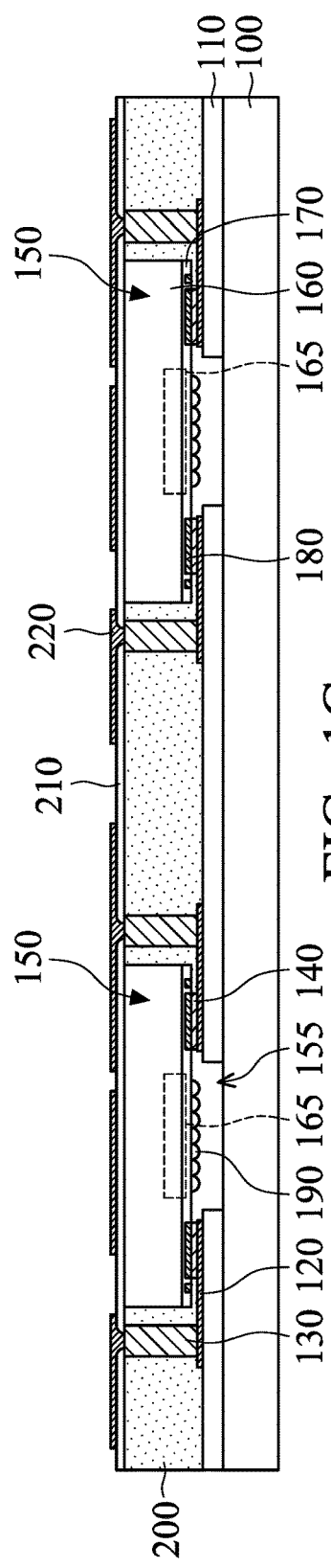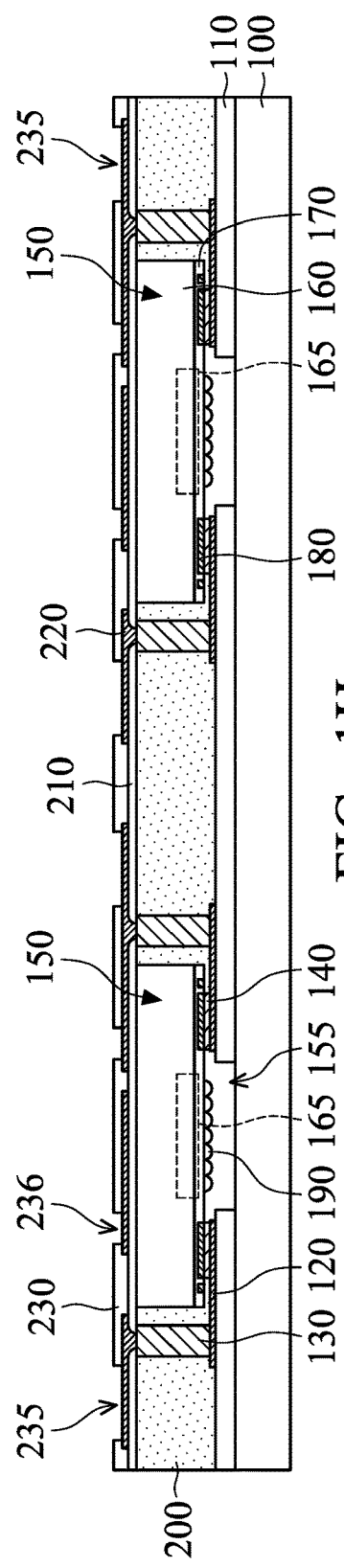
FIG. 1G
FIG. 1H

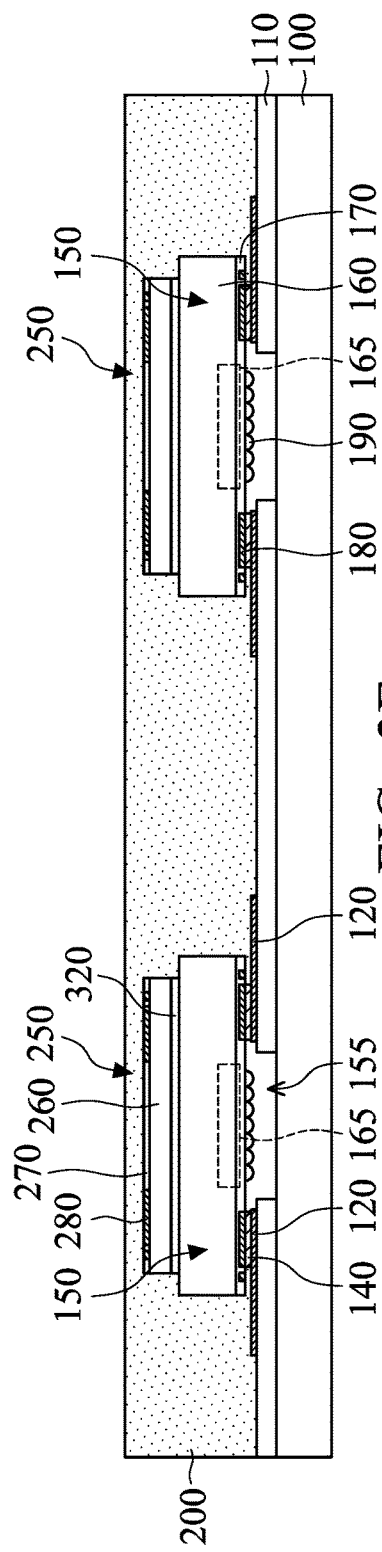
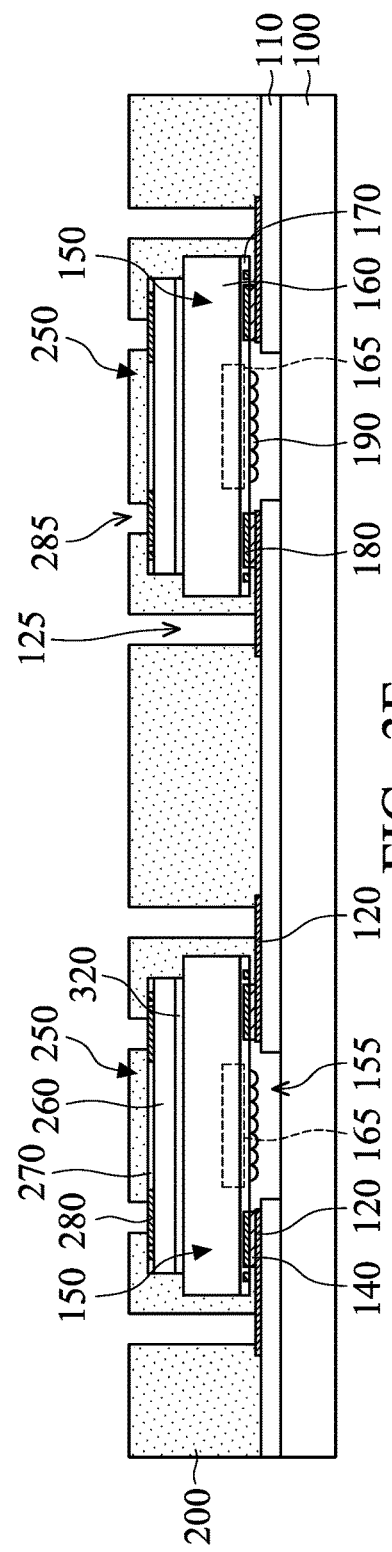
FIG. 3E
FIG. 3F

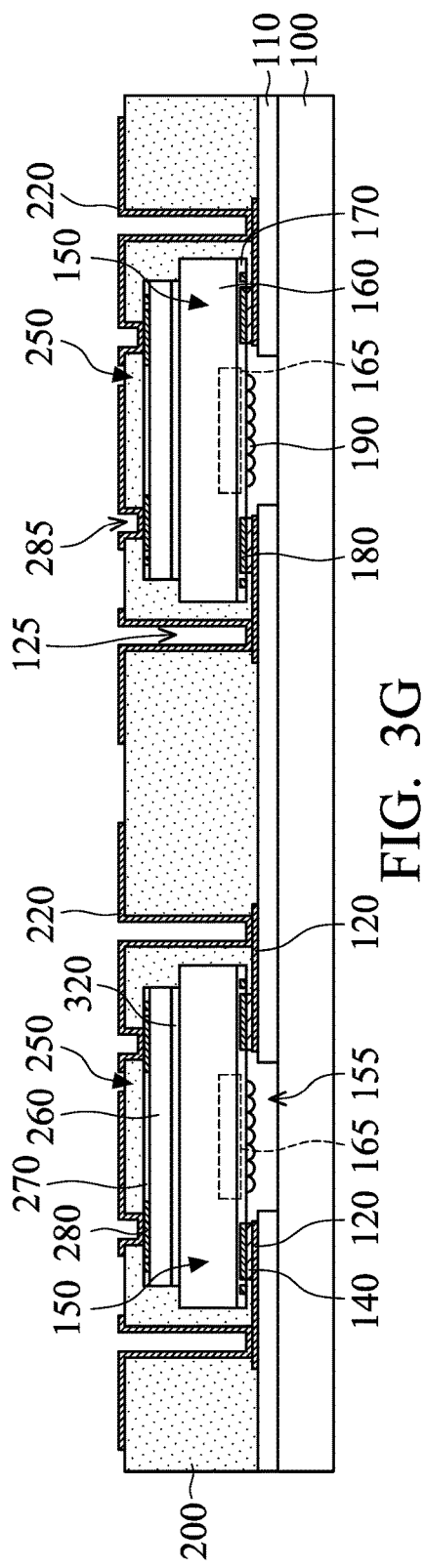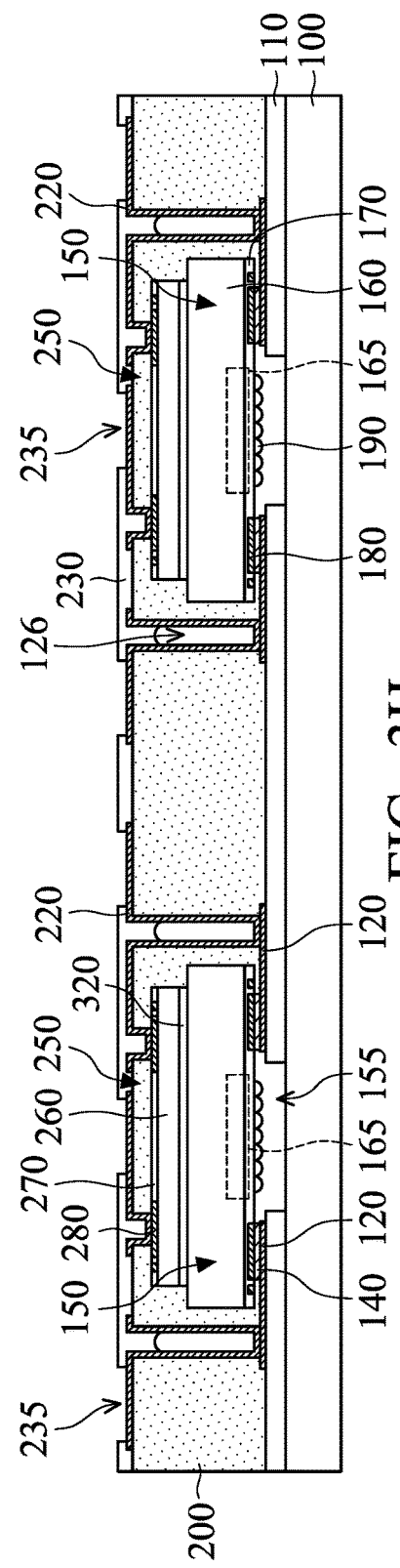

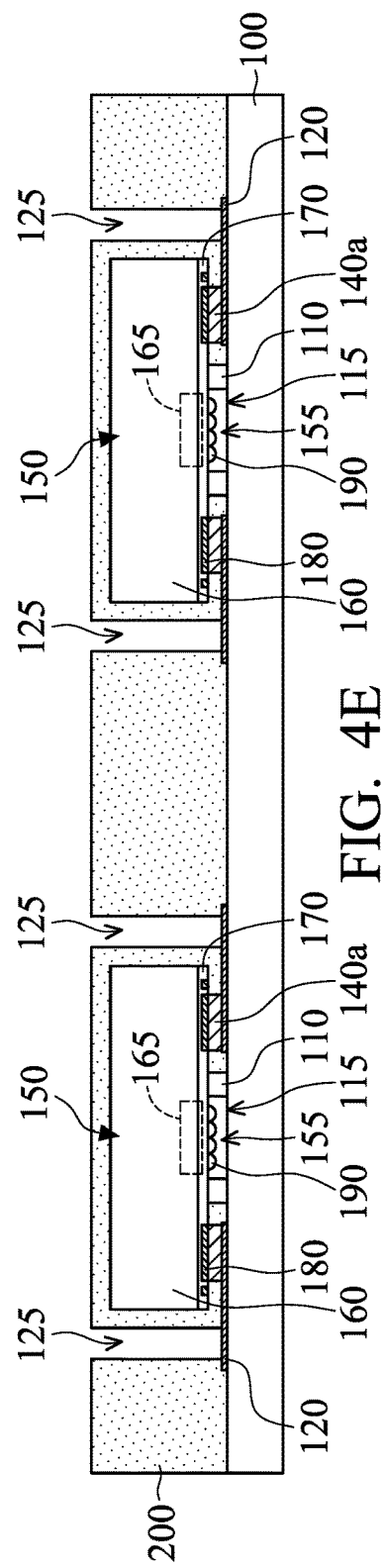
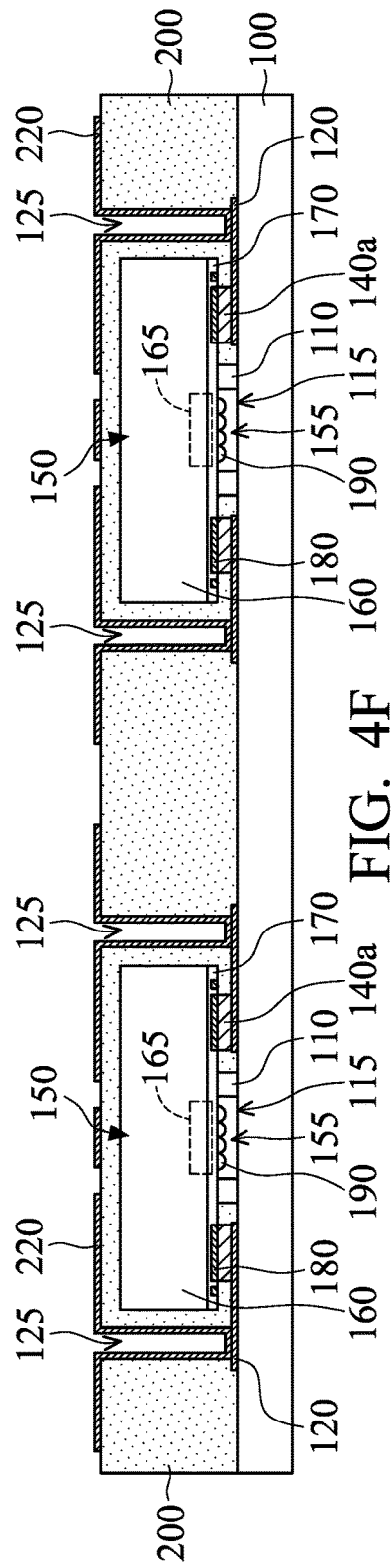
FIG. 4E
FIG. 4F

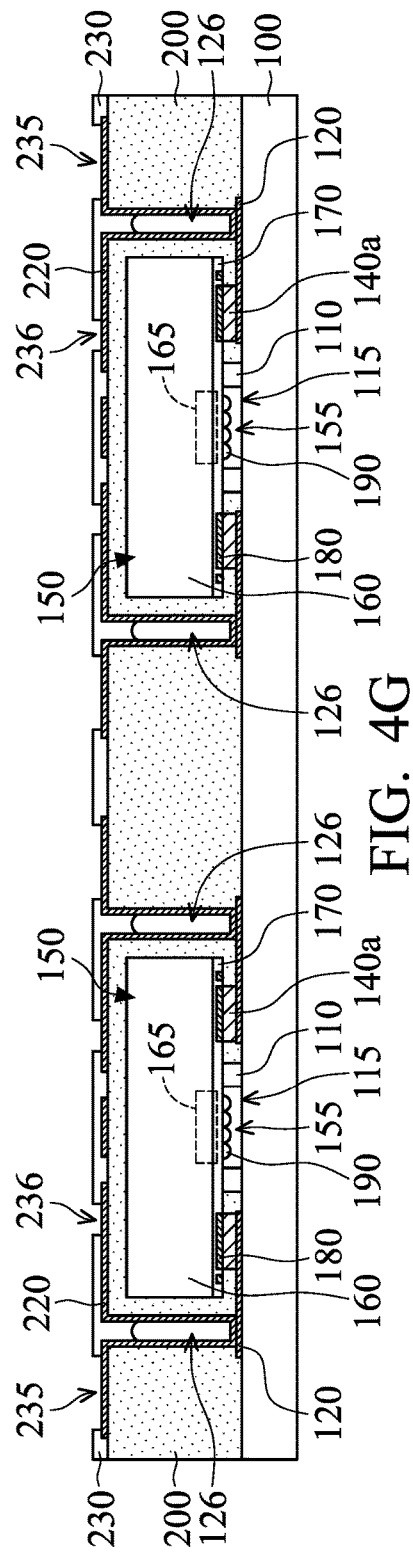
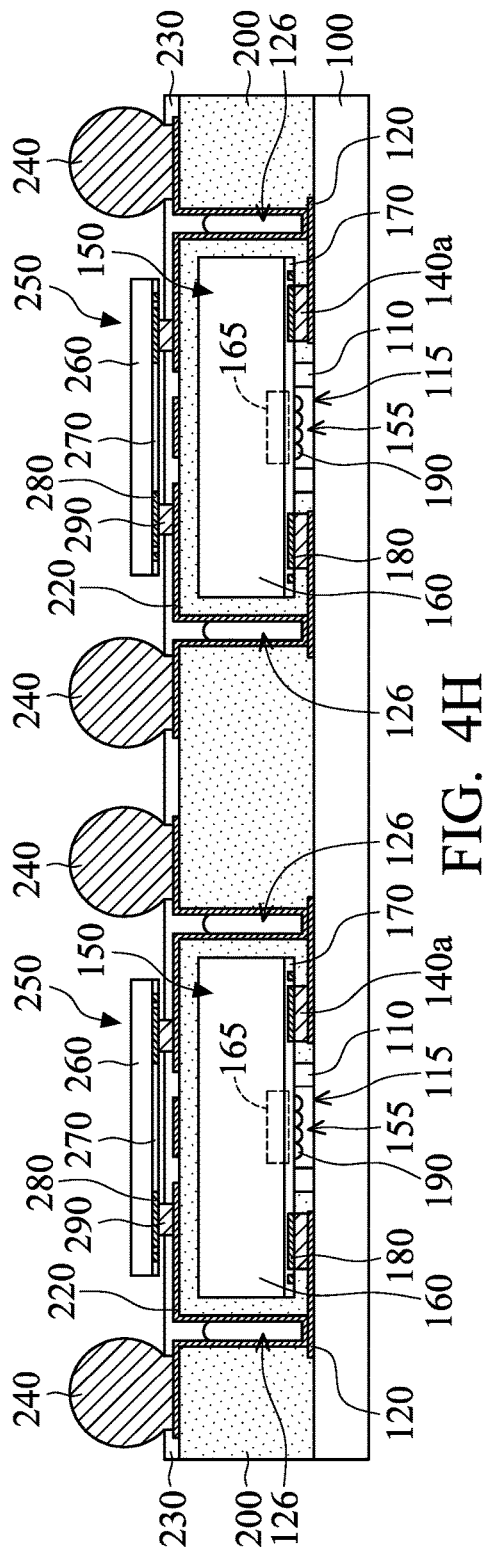

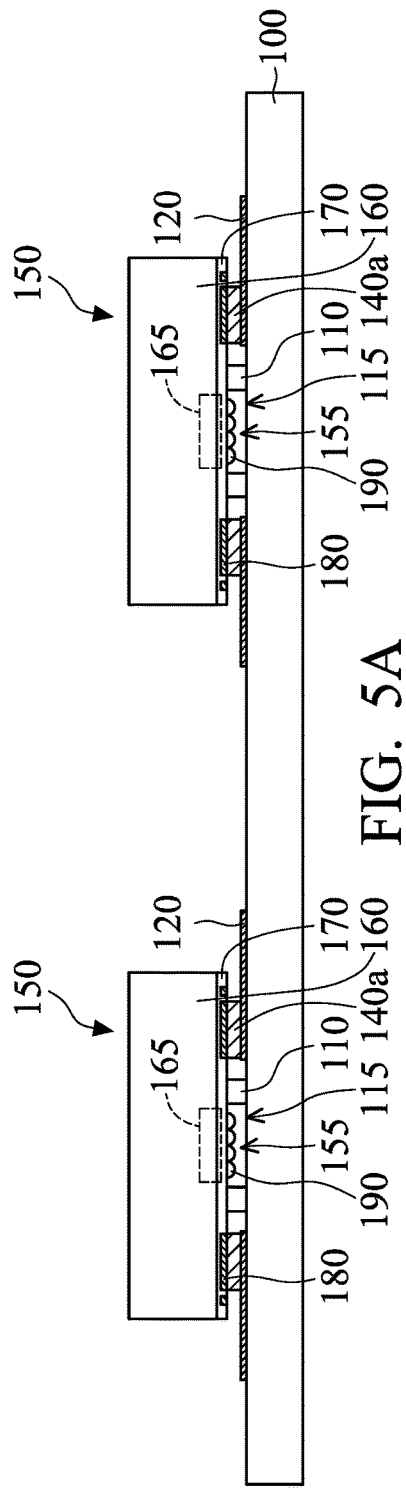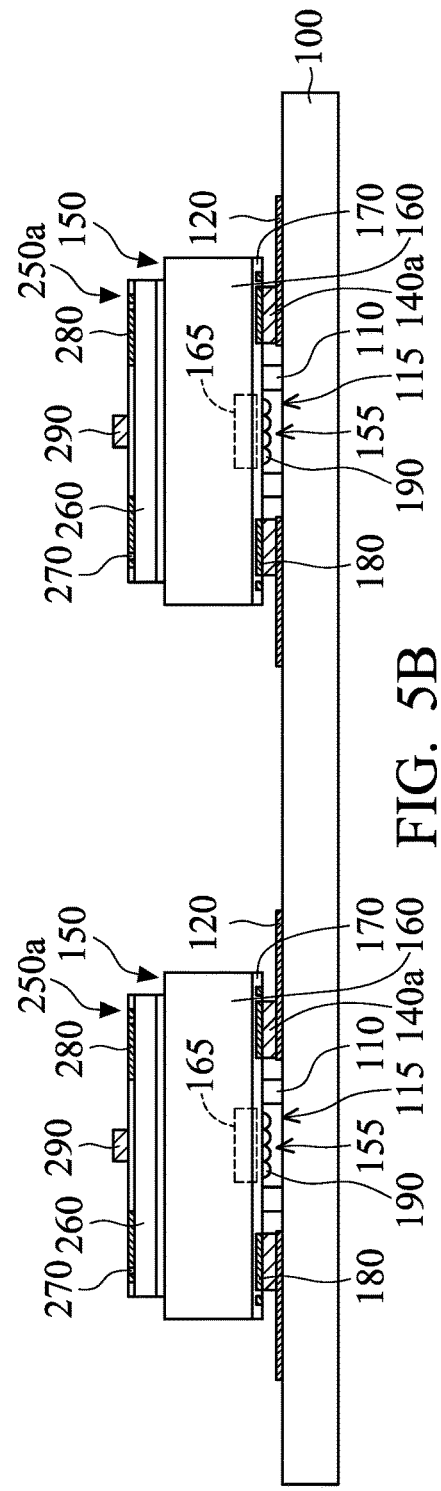
FIG. 5A
FIG. 5B

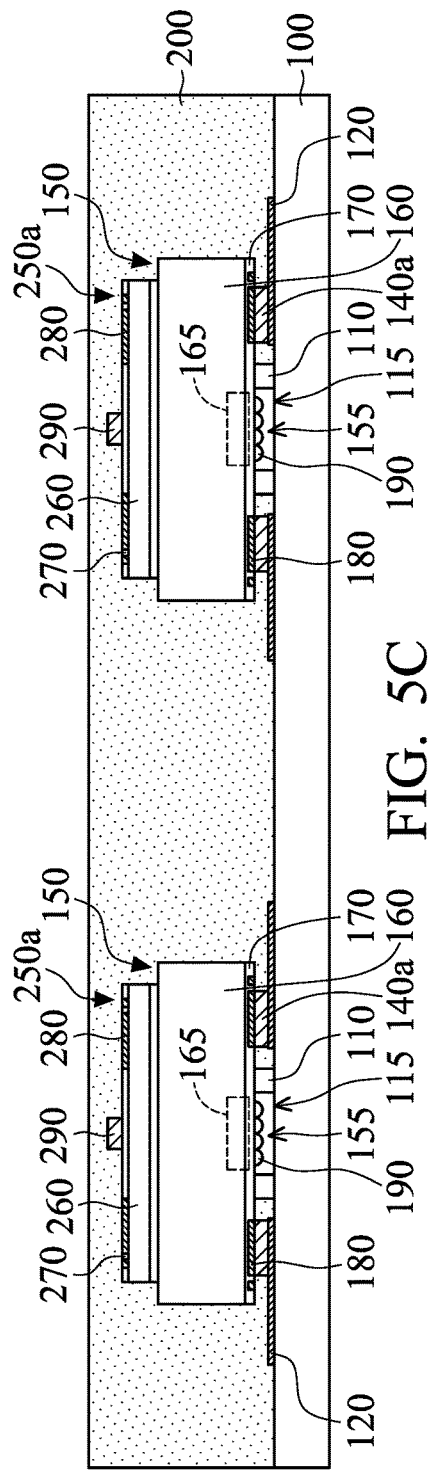
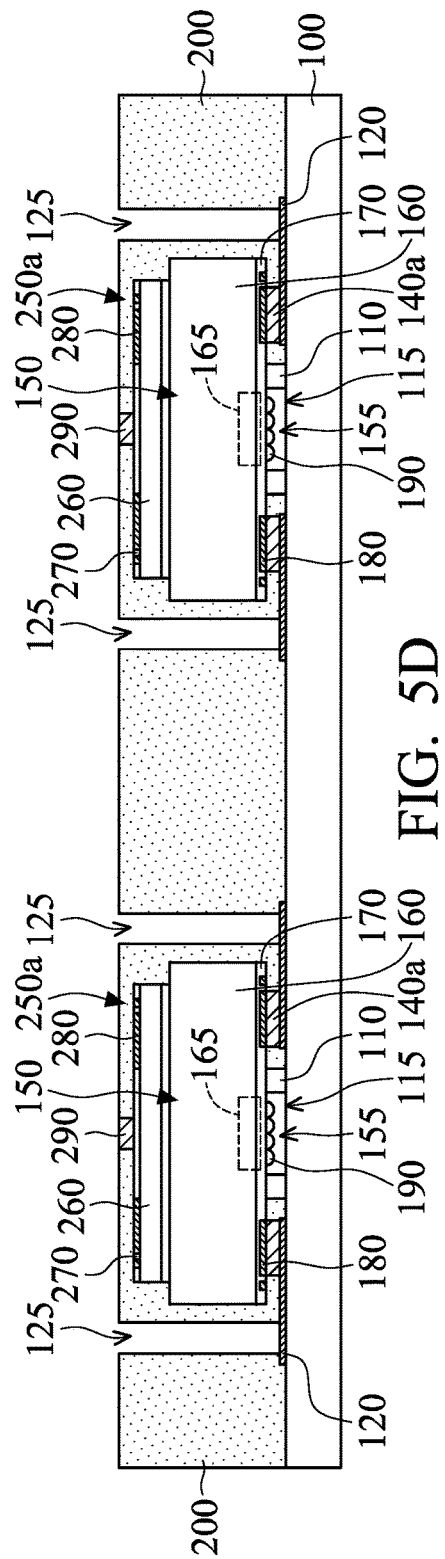

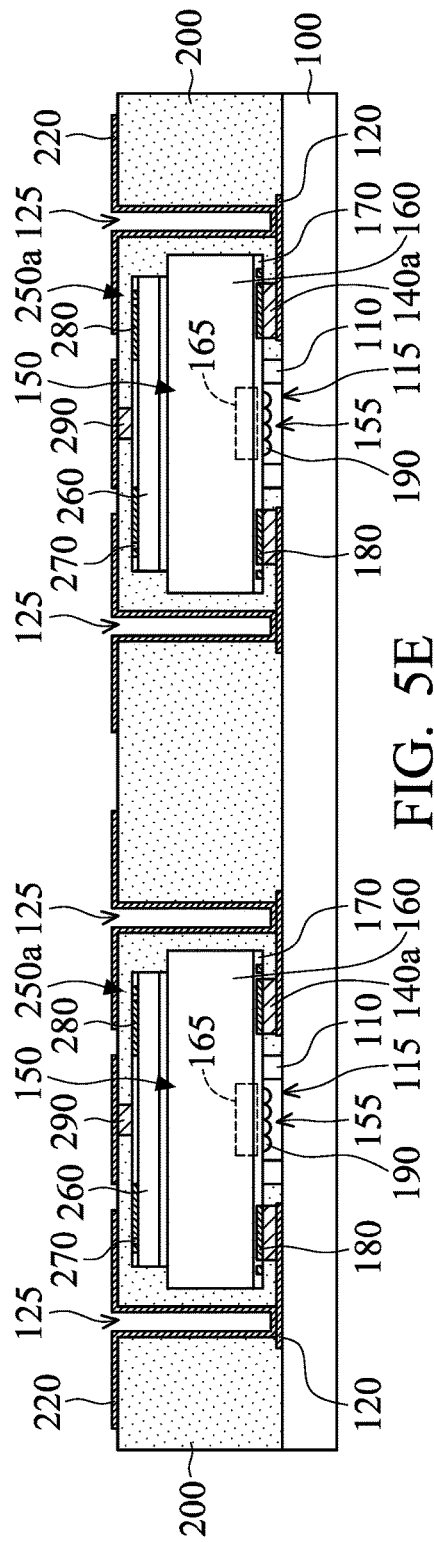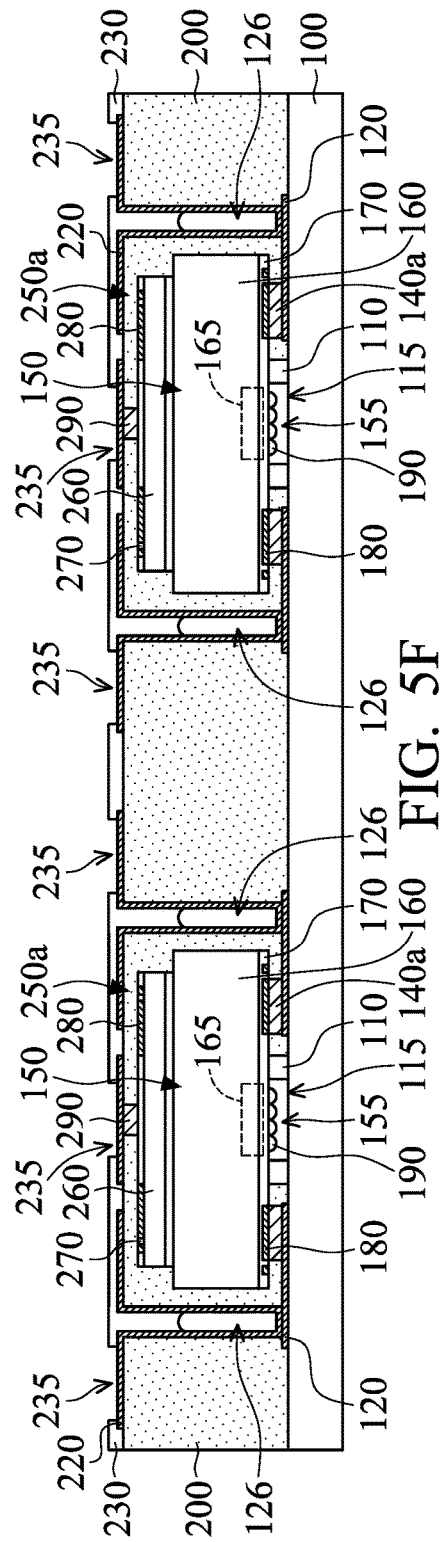

CHIP PACKAGE AND METHOD FOR FORMING THE SAME

CROSS REFERENCE TO RELATED APPLICATIONS

This application claims the benefit of U.S. Provisional Application No. 62/508,028 filed on May 18, 2017, the entirety of which is incorporated by reference herein.

BACKGROUND OF THE INVENTION

Field of the Invention

The invention relates to semiconductor package technology, and in particular to a chip package and methods for forming the same.

Description of the Related Art

The chip packaging process is an important step in the fabrication of electronic products. Chip packages not only protect the chips therein from outer environmental contaminants but also provide electrical connection paths between the electronic elements inside and those outside of the chip packages. For example, the chip package contains wires that may be used to form conductive paths. With the miniaturization of these electronic products, the dimensions of the chip packages have likewise been reduced.

In general, chip packages and other electronic elements (e.g., various integrated circuit chips, active elements, or passive elements) are individually disposed on a circuit board, and are indirectly electrically connected to each other. Although system-in-package (SiP) technology has been developed to reduce the size of the chip packages, the sensing surface of the chips with sensing devices cannot be shielded. As a result, the fabrication of chip packages with sensing devices using SiP technology is a big challenge, and therefore it is difficult to reduce the size of the circuit board and of the finished electronic product any further.

Accordingly, there exists a need for a novel chip package and methods for forming the same capable of eliminating or mitigating the aforementioned problems.

BRIEF SUMMARY OF THE INVENTION

An embodiment of the invention provides a chip package which includes a first redistribution layer (RDL), a first bonding structure, a first chip, a molding layer, a second redistribution layer, and a second chip. The first bonding structure is on the first redistribution layer. The first chip includes a sensing region and a conductive pad that are adjacent to an active surface. The first chip is bonded onto the first redistribution layer through the first bonding structure, and the first bonding structure is disposed between the conductive pad and the first redistribution layer. The molding layer covers the first redistribution layer and surrounds the first chip. The second redistribution layer is disposed on the molding layer and the first chip, and the second redistribution layer is electrically connected to the first redistribution layer. The second chip is stacked on a non-active surface of the first chip, and the second chip is electrically connected to the first chip through the second redistribution layer, the first redistribution layer and the first bonding structure.

An embodiment of the invention provides a method for forming a chip package which includes forming a first redistribution layer (RDL). A first bonding structure is formed on the first redistribution layer. A first chip is bonded onto the first redistribution layer through the first bonding structure. The first chip includes a sensing region and a conductive pad that are adjacent to an active surface. The first bonding structure is disposed between the conductive pad and the first redistribution layer. A molding layer is formed to cover the first redistribution layer and to surround the first chip. A second redistribution layer is formed on the molding layer and the first chip. The second redistribution layer is electrically connected to the first redistribution layer. The second chip is stacked on a non-active surface of the first chip, and the second chip is electrically connected to the first chip through the second redistribution layer, the first redistribution layer and the first bonding structure.

BRIEF DESCRIPTION OF THE DRAWINGS

The present invention can be more fully understood by reading the subsequent detailed description and examples with references made to the accompanying drawings, wherein:

FIGS. 1A to 1J are cross-sectional views of a method for forming a chip package according to some embodiments of the invention.

FIGS. 3A to 3J are cross-sectional views of a method for forming a chip package according to some embodiments of the invention.

FIGS. 4A to 4I are cross-sectional views of a method for forming a chip package according to some embodiments of the invention.

FIGS. 5A to 5H are cross-sectional views of a method for forming a chip package according to some embodiments of the invention.

DETAILED DESCRIPTION OF THE INVENTION

Figure 1I:
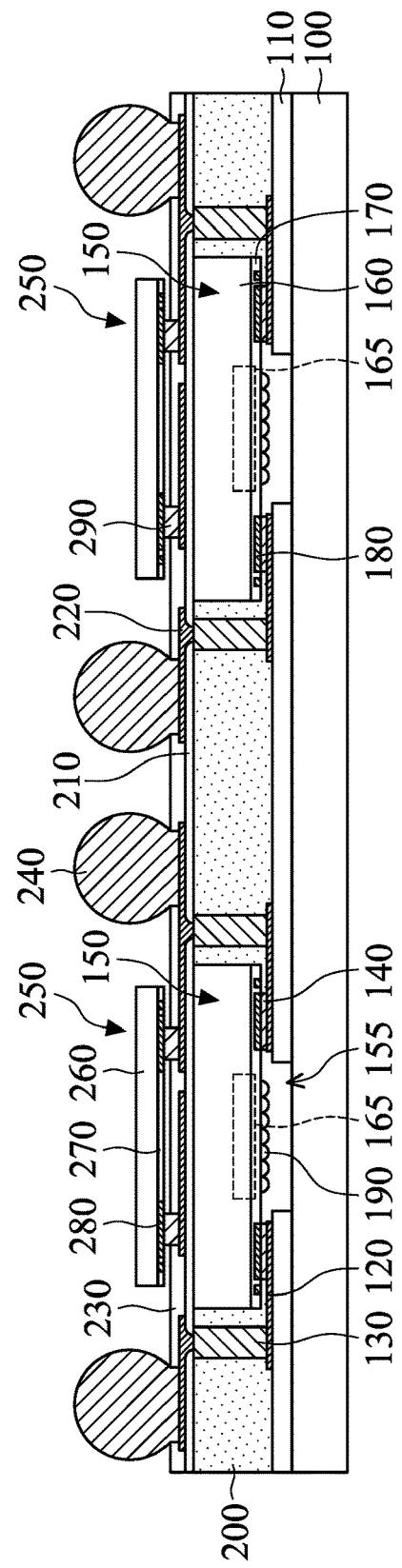

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of wafers having integrated circuits.

The following embodiments may discuss specific examples, such as a chip package applied in image sensing technology and methods for forming the same. However, those skilled in the art will recognize that various applications (e.g., biometric sensing technology) can be used in some other embodiments when they read the present disclosure. It is noted that the discussed embodiments herein may not describe each of elements that may exist in the structure. For example, the element may be omitted in the accompanying figures when various aspects of the embodiments can be sufficiently expressed through the discussion of the element. Moreover, the discussed embodiments herein may not describe each of manufacturing steps, and the method of forming the chip package may be discussed using a specific manufacturing step order. However, in some embodiments, the chip package can be fabricated by any reasonable manufacturing step order.

FIGS. 1A to 1J illustrates a chip package and a method for forming the same according to some embodiments of the invention, in which FIGS. 1A to 1J are cross-sectional views of a method for forming a chip package according to some embodiments of the invention.

Referring to FIG. 1A, a cover plate 100 is provided. In some embodiments, the cover plate 100 includes a transparent material. For example, the cover plate 100 may include glass, aluminum nitride (AlN) or another suitable transparent material. In some other embodiments, the cover plate 100 may serve as a temporary carrier and will be removed in subsequent processes. In those cases, the cover plate 100 may include a transparent or opaque carrier material. In some embodiments, the shape of the cover plate 100 is circular or rectangular and the size of the cover plate 100 is not limited. For example, the cover plate 100 has the same size as an 8-inch or 12-inch wafer.

Afterwards, in some embodiments, a spacer layer (or dam) 110 is formed on the cover plate 100. The spacer layer 110 includes openings 115, as shown in FIG. 1A. In some embodiments, the spacer layer 110 does not substantially absorb moisture. The spacer layer 110 may be in direct contact with the spacer layer 110 and the spacer layer 110 may be non-adhesive. In some embodiments, the spacer layer 110 is formed by a deposition process (such as a coating process, a physical vapor deposition process, a chemical vapor deposition process or another suitable process). In some embodiments, the spacer layer 110 includes epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), or another suitable insulating material. Alternatively, the spacer layer 110 may include a photoresist material that can be patterned by exposure and development processes, so as to form the openings 115.

Embodiments of the present disclosure include various aspects. In some other embodiments, the spacer layer 110 can be replaced by an adhesive layer. Such an adhesive layer may not have openings and may include a transparent material.

Referring to FIG. 1B, a patterned redistribution layer (RDL) 120 (which is also referred to as a first redistribution layer) is formed on the spacer layer 110. In some embodiments, the redistribution layer 120 may include aluminum, copper, gold, platinum, nickel, tin, a combination thereof, a conductive polymer material, a conductive ceramic material (such as indium tin oxide or indium zinc oxide), or another suitable conductive material. In some embodiments, the patterned redistribution layer 120 is formed by a deposition process (such as a coating process, a physical vapor deposition process, a chemical vapor deposition process, an electroplating process, an electroless plating process or another suitable process) and lithography and etching processes.

Next, conductive structures 130 are formed on the redistribution layer 120, as shown in FIG. 1B. In some embodiments, the conductive structures 130 and the spacer layer 110 are in direct contact with the redistribution layer 120 and a portion of the redistribution layer 120 is interposed between the conductive structures 130 and the spacer layer 110.

The conductive structures 130 may include pillars, bumps or other suitable conductive structures. In some embodiments, the conductive structures 130 include copper, copper alloy, titanium, titanium alloy, combinations thereof, and other suitable materials. In some embodiments, the conductive structures 130 are formed on the redistribution layer 120 by a deposition process (such as an electroplating process, an electroless plating process or another suitable process). For example, a masking layer (not shown) having openings may be formed on the spacer layer 110 and the redistribution layer 120. The masking layer may include a photoresist material. The openings of the masking layer define the positions where the conductive structures 130 are to be formed. Next, a deposition process is performed, so as to form the conductive structures 130 in the openings of the masking layer. Afterwards, the masking layer is removed.

Referring to FIG. 1C, first chips 150 are bonded onto the redistribution layer 120 through first bonding structures 140. The first bonding structure 140 may include a conductive layer, a conductive paste, a conductive glue, a conductive bump or another suitable bonding structure. In some embodiments, the first bonding structures 140 include tin, solder, silver or a combination thereof, or another suitable conductive material. In some embodiments, the first bonding structure 140 and the conductive structures 130 include different materials. For example, the first bonding structures 140 include, but are not limited to tin. The conductive structures 130 include, but are not limited to copper.

In some embodiments, the first bonding structures 140 are formed on the redistribution layer 120 and the first chips 150 are placed on the first bonding structures 140 in such a manner that the active surface faces the cover plate 100, and followed by a reflow process, so that each first chip 150 is connected to the redistribution layer 120 through the first bonding structures 140. In some other embodiments, the first bonding structures 140 are coated onto the redistribution layer 120, so that each first chip 150 is adhered onto the redistribution layer 120 through the first bonding structures 140.

In some embodiments, the first bonding structures 140 and the spacer layer 110 are in direct contact with the redistribution layer 120, and a portion of the redistribution layer 120 is interposed between the first bonding structures 140 and the spacer layer 110. In some embodiments, the thickness (or height) of the conductive structures 130 is less than the thickness (or height) of the first chip 150, as shown in FIG. 1C, and the thickness of the conductive structures 130 is greater than the thickness of the first bonding structures 140.

In some embodiments, the first chip 150 has the function of sensing images or biometrics. For example, the first chip 150 may be a complementary metal-oxide-semiconductor (CMOS) image sensor (CIS) chip, an optical fingerprint sensor (FPS) chip, a capacitive fingerprint sensor chip, or another suitable sensor chip.

In some embodiments, the first chip 150 includes a substrate 160, a sensing region 165, an insulating layer 170, conductive pads 180, and an optical component 190, as shown in FIG. 1C. The sensing region 165, the insulating layer 170, the conductive pads 180, and the optical component 190 are adjacent to the active surface of the first chip 150, and the non-active surface of the first chip 150 is substantially equal to the rear surface of the substrate 160. In some embodiments, the first chip 150 does not include the optical component 190.

In some embodiments, the substrate 160 is a silicon substrate or another semiconductor substrate. The insulating layer 170 is on the front surface of the substrate 160. In general, the insulating layer 170 may be formed of an interlayer dielectric (ILD) layer, an inter-metal dielectric (IMD) layer, and a passivation layer covering thereon. To simplify the diagram, only a single insulating layer 170 is depicted herein. In some embodiments, the insulating layer 170 may include an inorganic material, such as silicon oxide, silicon nitride, silicon oxynitride, metal oxide, or a combination thereof, or another suitable insulating material.

The conductive pads 180 are in the insulating layer 170 and the passivation layer of the insulating layer 170 has openings that expose the conductive pads 180. In some embodiments, the conductive pad 180 is formed of a single conductive layer or multiple conductive layers. In some embodiments, the conductive pads 180 are electrically connected to the sensing region 165 through the interconnect structures (not shown) in the insulating layer 170. The interconnect structure may include conductive lines, conductive vias and conductive contacts.

The sensing region 165 may include a sensing element or another suitable electronic element. In some embodiments, the sensing region 165 includes a light-sensing element or another suitable optoelectronic element. In some other embodiments, the sensing region 165 includes a sensing element which is configured to sense biometrics (such as a fingerprint-recognition element), or a sensing element which is configured to sense environmental characteristics (such as a temperature-sensing element, a humidity-sensing element, a pressure-sensing element or a capacitance-sensing element) or another suitable sensing element.

The optical component 190 is disposed on the insulating layer 170 and corresponds to the sensing region 165. In some embodiments, the optical component 190 is a micro-lens array, a color filter layer, a combination thereof, or another suitable optical component. In some embodiments, the spacer layer 110 has openings 115 (indicated in FIG. 1A). After the first chips 150 are bonded onto the redistribution layer 120, the spacer layer 110 forms a cavity 155 (as shown in FIG. 1C) between the active surface of each first chip 150 and the cover plate 100 and corresponding to the sensing region 165 of each first chip 150, so that the optical component 190 is located in the corresponding cavity 155 and is protected by the cover plate 100.

Referring to FIG. 1D, a molding layer 200 is formed on the spacer layer 110 and the redistribution layer 120. The molding layer 200 surrounds the conductive structures 130 and each of the first chips 150. The molding layer 200 may be referred to as an encapsulating layer. In some embodiments, the molding layer 200 is in direct contact with the spacer layer 110, the redistribution layer 120, the conductive structures 130, and the first chips 150. In some embodiments, the molding layer 200 includes a molding compound material. For example, the molding layer 200 may include epoxy, resin, moldable polymer, or another suitable material.

In some embodiments, the molding layer 200 is a ductile solid, such as a tape formed of a molding compound material. The tape may be attached onto the spacer layer 110 and cover the redistribution layer 120, the conductive structures 130, and the first chips 150. In some embodiments, the molding layer 200 is formed by encapsulation molding and curing processes. In some embodiments, the molding layer 200 that is substantially a liquid is coated and then is cured by chemical reaction. In some embodiments, the molding layer 200 is an ultraviolet (UV) curable glue layer or a glue layer including thermosetting polymer and is cured by UV light or heat.

In some embodiments, the molding layer 200 covers the conductive structures 130 and the non-active surface of each first chip 150 (i.e., the rear surface of the substrate 160). Afterwards, a thinning process is performed on the molding layer 200 until the conductive structures 130 are exposed, as shown in FIG. 1E. The thinning process may include a polishing process, a grinding process, a milling process or another suitable process. In some embodiments, the thickness of the conductive structures 130 is less than that of the first chip 150. Therefore, the first chips 150 are also thinned during the thinning of the molding layer 200, so as to expose the conductive structures 130. For example, the substrate 160 is thinned from its rear surface, so as to reduce the thickness of the substrate 160.

In some other embodiments, the substrate 160 is thinned before the first chip 150 is bonded, so that the thickness of the first chip 150 is less than or substantially equal to the thickness of the conductive structures 130. As a result, the first chip 150 is not thinned during the thinning of the molding layer 200. According to some embodiments, the first chip 150 is thinned during the thinning of the molding layer 200 can simplify the process and reduce the cost of manufacturing.

Referring to FIG. 1F, an insulating layer 210 is formed on the molding layer 200 and the non-active surface of each first chip 150. In some embodiments, the insulating layer 210 includes epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), or another suitable insulating material. In some embodiments, the insulating layer 210 is formed by a deposition process (such as a coating process, a physical vapor deposition process, a chemical vapor deposition process or another suitable process). Next, openings 215 are formed in the insulating layer 210 by lithography and etching processes. The openings 215 expose the conductive structures 130 that are surrounded by the molding layer 200.

In some embodiments, after the thinning process is performed, the first chip 150, the conductive structures 130 and the molding layer 200 have surfaces which are substantially coplanar. The insulating layer 210 is in direct contact with the non-active surface of the corresponding first chip 150, the conductive structures 130, and the molding layer 200. In some other embodiments, a portion of the molding layer 200 is interposed between the non-active surface of each first chip 150 and the corresponding insulating layer 210, so as to separate the first chip 150 from the corresponding insulating layer 210.

Referring to FIG. 1G, a patterned redistribution layer 220 (which is also referred to as a second redistribution layer) is formed on the insulating layer 210. The redistribution layer 220 fills the openings 215 of the insulating layer 210 and is electrically and physically connected to the conductive structures 130 (which are surrounded by the molding layer 200) through the openings 215. In some embodiments, a portion of the redistribution layer 220 overlaps with the sensing region 165 of the first chip 150 as viewed from a top-view perspective. In some embodiments, a portion of the insulating layer 210 is interposed between the non-active surface of the first chips 150 and the redistribution layer 220.

In some embodiments, the redistribution layer 220 includes aluminum, copper, gold, platinum, nickel, tin, a combination thereof, a conductive polymer material, a conductive ceramic material (such as indium tin oxide or indium zinc oxide), or another suitable conductive material. In some embodiments, the patterned redistribution layer 220 is formed by a deposition process (such as a coating process, a physical vapor deposition process, a chemical vapor deposition process, an electroplating process, an electroless plating process or another suitable process) and lithography and etching processes.

Referring to FIG. 1H, a protective layer 230 is formed on the insulating layer 210 by a deposition process, so as to cover the redistribution layer 220. In some embodiments, the protective layer 230 includes epoxy resin, solder mask, inorganic materials (such as silicon oxide, silicon nitride, silicon oxynitride, metal oxide, or a combination thereof), organic polymer materials (such as polyimide, butylcyclobutene (BCB), parylene, polynaphthalenes, fluorocarbons or acrylates), or another suitable insulating material.

Next, openings 235 and openings 236 are formed in the protective layer 230, so as to expose portions of the redistribution layer 220. In some embodiments, as shown in FIG. 1H, as viewed from a top-view perspective, openings 235 overlap the molding layer 200, and openings 236 overlap the first chip 150. In some embodiments, the size (e.g., width) of the opening 235 is greater than that of the opening 236.

Referring to FIG. 1I, conductive structures 240 are formed on the redistribution layer 220 that is exposed from the openings 235, and the conductive structures 240 completely fill the openings 235. The bottoms of the conductive structures 240 are surrounded by protective layer 230, and the tops of the conductive structures 240 are over the protective layer 230. The conductive structures 240 are electrically connected to the first chips through the redistribution layer 220, the conductive structures 130, the redistribution layer 120, and the first bonding structures 140.

In some embodiments, the conductive structures 240 are solder balls, conductive bumps, conductive pillars, or other suitable conductive structures. In some embodiments, the conductive structure 240 includes tin, lead, copper, gold, nickel, a combination thereof, or another suitable conductive material. In some embodiments, the conductive structure 240 and the first bonding structure 140 include the same material, such as tin or another suitable conductive material. In some embodiments, the conductive structures 240 are formed on the redistribution layer 220 by a ball placement process, a screen printing process, an electroplating process, or another suitable process, and followed by a reflow process.

After the conductive structures 240 are formed, second chips 250 are bonded onto the redistribution layer 220 exposed from the openings 260, so that each of the second chips 250 stacks on the non-active surface of the corresponding first chip 150, as shown in FIG. 1I. In some embodiments, the second chip 250 overlaps with the sensing region 165 of the corresponding first chip 150, as viewed from a top-view perspective. In some embodiments, the thickness (or height) of the second chip 250 is less than the thickness (or height) of the conductive structures 240, so as to be useful for bonding the conductive structures 240 onto another component (e.g., circuit board).

In some embodiments, both the first chip 150 and the second chip 250 are known good dies. In some embodiments, the first chip 150 and the second chip 250 have different functionalities. In some embodiments, the second chip 250 does not have sensor functionality. For example, the second chip 250 may include an application-specific integrated circuit (Application-specific integrated circuit, ASIC), a signal processor, or anther electronic component.

In some embodiments, each second chip 250 includes a substrate 260, an insulating layer 270, and conductive pads 280, as shown in FIG. 1I. The insulating layer 270 and the conductive pads 280 are adjacent to the active surface of the second chip 250, and the non-active surface of the second chip 250 is substantially equal to the rear surface of the substrate 260. In some embodiments, the second chip 250 does not include a sensing region and an optical component.

In some embodiments, the substrate 260 is a silicon substrate or another semiconductor substrate. The insulating layer 270 is on the front surface of the substrate 260. In general, the insulating layer 270 may be formed of an interlayer dielectric (ILD) layer, an inter-metal dielectric (IMD) layer, and a passivation layer covering thereon. To simplify the diagram, only a single insulating layer 270 is depicted herein. In some embodiments, the insulating layer 270 may include an inorganic material, such as silicon oxide, silicon nitride, silicon oxynitride, metal oxide, or a combination thereof, or another suitable insulating material.

The conductive pads 280 are in the insulating layer 270 and the passivation layer of the insulating layer 270 has openings that expose the conductive pads 280. In some embodiments, the conductive pad 280 is formed of a single conductive layer or multiple conductive layers. In some embodiments, the conductive pads 280 are electrically connected to the interconnect structures (not shown) in the insulating layer 270.

As shown in FIG. 1I, the second chips 250 may be bonded onto the redistribution layer 220 through second bonding structures 290. The second bonding structures 290 completely fill the openings 236. In some embodiments, both the second bonding structures 290 and the conductive structure 240 are on the redistribution layer 220, and therefore the second bonding structures 290 and the conductive structure 240 are located at the same level. The second bonding structures 290 may include conductive bumps or other suitable bonding structures. In some embodiments, the second bonding structures 290 may tin, lead, copper, gold, nickel, a combination thereof, or another suitable conductive material. In some embodiments, the second bonding structures 290 are formed by a screen printing process, an electroplating process, or another suitable process, and followed by a reflow process.

Figure 1J:
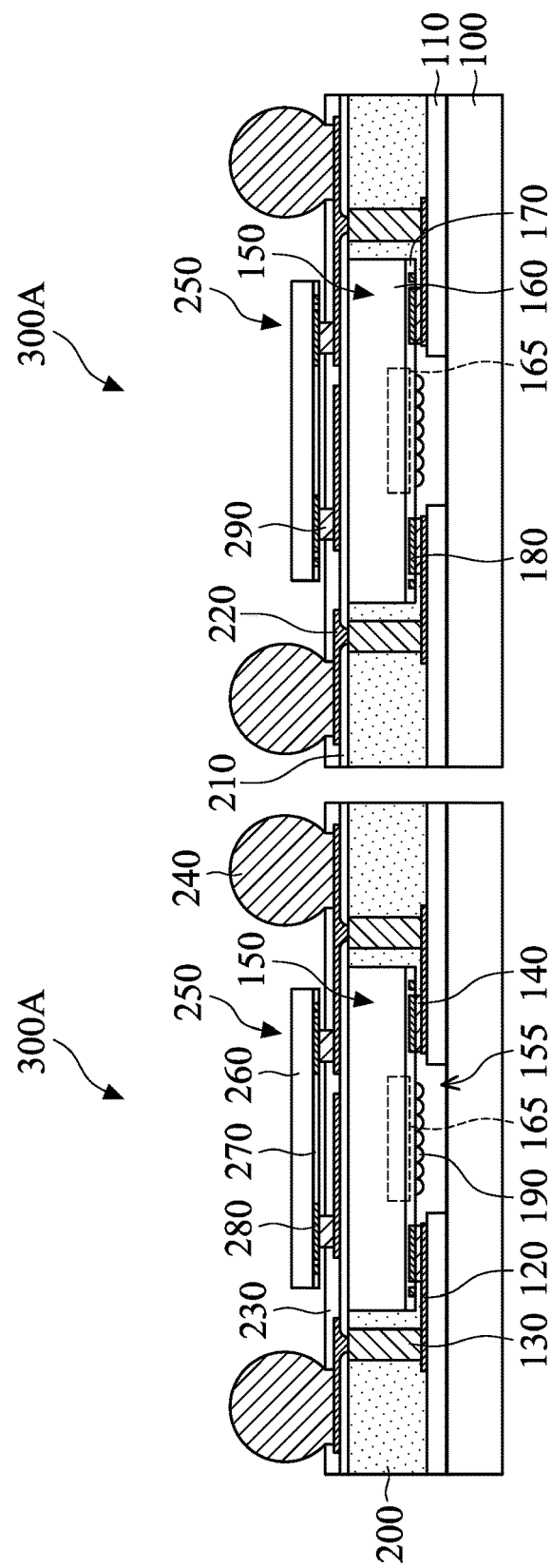

Referring to FIG. 1J, in some embodiments, the protective layer 230, the insulating layer 210, the molding layer 200, the spacer layer 110 and the cover plate 100 are cut along the scribe lines, so as to form individual chip packages 300A. For example, a dicing process is performed using dicing blade or laser, in which the use of a laser dicing process may prevent the upper and lower films from shifting. In some other embodiments, the first chip 150 is a capacitive fingerprint sensor chip and the cover plate 100 is merely a temporary carrier. Accordingly, the formed chip package 300A does not include the cover plate 100 and the spacer layer 110.

In some embodiments, each of the chip packages 300A includes one first chip 150 and one second chip 250 that have different functionalities, as shown in FIG. 1J. However, embodiments of the present disclosure include various aspects. In some other embodiments, multiple second chips 250 are stacked on one first chip 150. In some other embodiments, one or more third chips 255 are stacked on one first chip 150, in which the structure and arrangement of the third chips 255 may substantially be the same as or similar to the structure and arrangement of the second chips 250. Alternatively, the first chip 150, the second chip 250, and the third chip 255 have different functionalities from each other.

Figure 2:
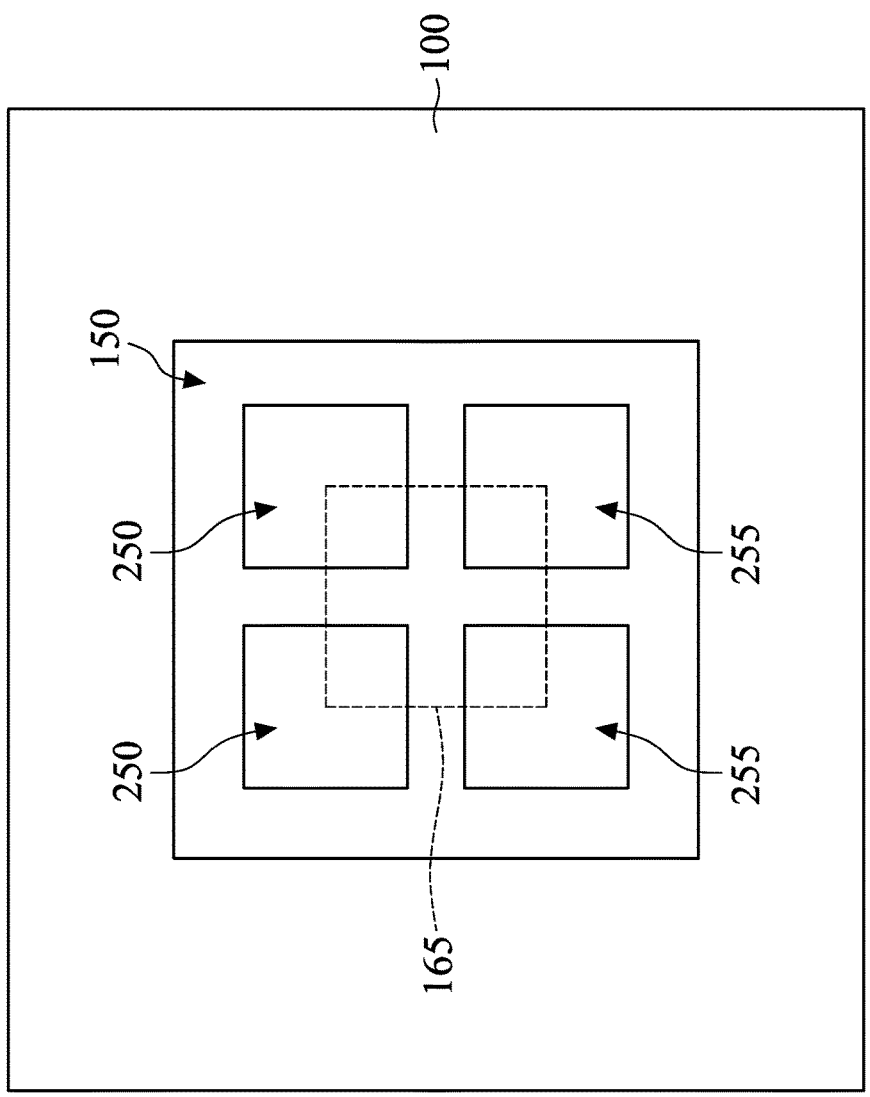
FIG. 2 is a plan view of a chip package according to some embodiments of the invention.

For example, FIG. 2 is a plan view of a chip package according to some embodiments of the invention. For the purpose of clarity and simplicity, only the cover plate 100, the first chip 150, the sensing region 165, the second chip 250 and the third chip 255 are depicted in FIG. 2. In some embodiments, the chip package includes one first chip 150 and the second chips 250 and the third chips 255 are stacked on the first chip 150. The second chips 250 and the third chips 255 partially overlap the sensing region 165 of the first chip 150, as viewed from a top-view perspective.

In some examples, since the sensing surface of the sensor chip cannot be shielded, the electrical connection paths between the stacked chips may be formed by through-silicon via (TSV) technology. However, the through-silicon via technology involves that a silicon substrate is bonded onto a temporary carrier and then an etching process is performed on the silicon substrate, so as to form through holes in the silicon substrate and exposing the conductive structures. Moreover, the through-silicon via technology also involves that an insulating layer is formed in the through hole, so as to electrically isolate silicon substrate from the subsequently formed conductive layers. An etching process is performed on the insulating layer, so as to remove the insulating layer covering the conductive structures, so that the subsequently formed conductive layers are electrically connected to the exposed conductive structures. Afterwards, there is a need to remove the temporary carrier.

Accordingly to foregoing embodiments, the first chip 150 and the second chip 250 are electrically connected to each other through the first bonding structures 140, the redistribution layer 120, the conductive structures 130 in the molding layer 200, the redistribution layer 220, and the second bonding structures 290, and there is no need to employ the through-silicon via technology. In particular, there is no need to perform an etching process on a silicon substrate and the insulating layer in the through hole, and there is also no need to bond and remove the temporary carrier. Accordingly, the process steps can be simplified, the manufacture time can be reduced, and the manufacture cost can be greatly reduced.

The electrical connection path between the first chip 150 and the second chip 250 is formed by the conductive structures 130 outside of the first chip 150. Moreover, the molding layer 200 with an adequate thickness is between the conductive structures 130 and the first chip 150. Therefore, leakage between the conductive structures 130 and the first chip 150 can be reduced or eliminated. Moreover, since the first chip 150 is encapsulated by the molding layer 200, the structure strength of the chip package 300A can be increased further. Accordingly, when a reliability test is performed on the chip package 300A, the first chip 150 can be protected by the molding layer 200, thereby increasing the device performance and reliability of the chip package 300A.

Moreover, since the structure strength is increased due to encapsulation of the first chip 150 via the molding layer 200, crack or other structural problems would not occur. Therefore, the size (e.g., the thickness) of the first chip 150 that is protected by the molding layer 200 can be reduced further. As a result, the chip package 300A may have a smaller size, and the sizes of the subsequently bonded circuit board and the formed electronic product are also reduced further. In other words, the size of the first chip 150 can be controlled via the molding layer 200, so that the design flexibility for the size of the chip package 300A is increased.

FIGS. 3A to 3J illustrates a chip package and a method for forming the same according to some embodiments of the invention, in which FIGS. 3A to 3J are cross-sectional views of a method for forming a chip package according to some embodiments of the invention. Elements in FIGS. 3A to 3J that are the same as those in FIGS. 1A to 1J are labeled with the same reference numbers as in FIGS. 1A to 1J and may be not described again for brevity.

Figure 3A:
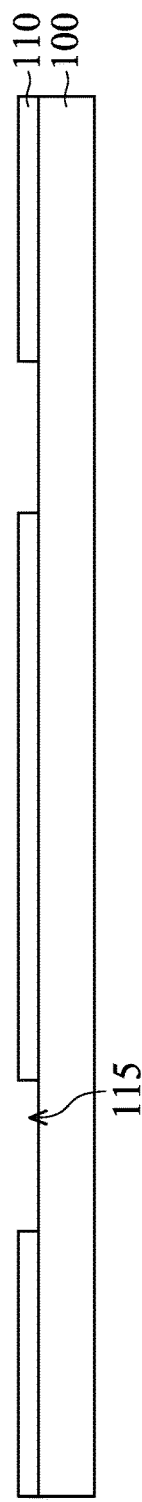
Figure 3B:
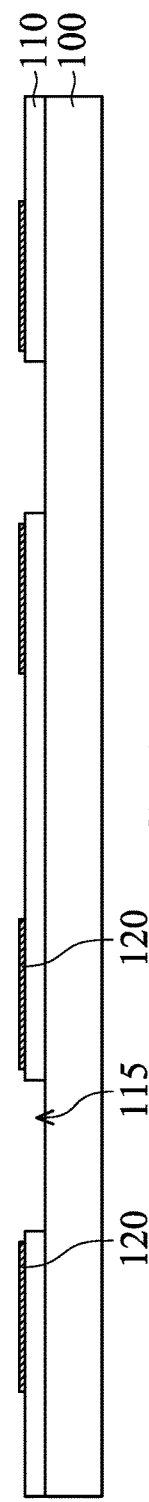

Referring to FIG. 3A, the structure as shown in FIG. 1A is provided. Namely, a spacer layer 110 having openings 115 is formed on a cover plate 100. Next, a patterned redistribution layer (RDL) 120 is formed on the spacer layer 110 by the same or a similar method as that shown in FIG. 1B, as shown in FIG. 3B. However, the conductive structures 130 shown in FIG. 1B are not formed on the redistribution layer 120 shown in FIG. 3B.

Figure 3C:
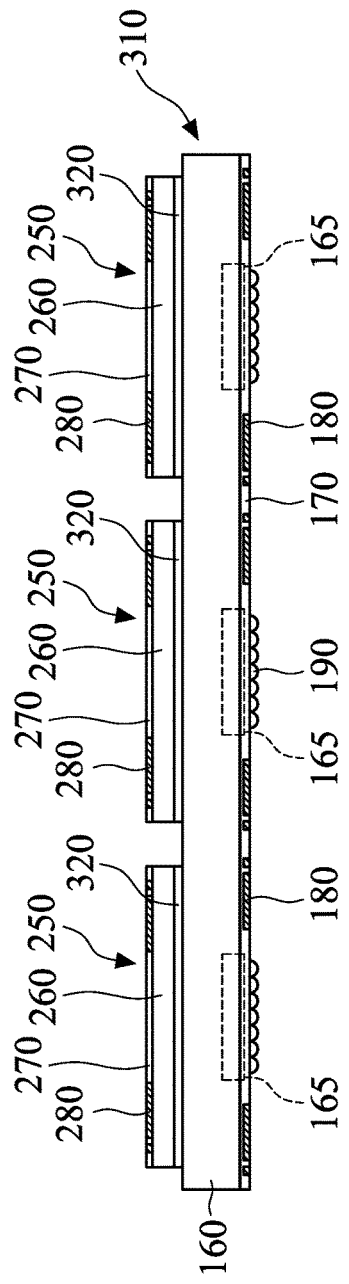

Referring to FIG. 3C, a wafer 310 is provided. The wafer 310 includes a substrate 160, sensing regions 165, an insulating layer 170, conductive pads 180, and optical components 190. The substrate 160 may be a semiconductor wafer so as to facilitate the wafer-level packaging process. Next, second chips 250 are bonded onto the wafer 310, as shown in FIG. 3C. In some embodiments, the second chips 250 are known good dies. In particular, the non-active surface of the second chips 250 faces the non-active surface of the wafer 310. The non-active surface of the second chips 250 is attached onto the non-active surface of the wafer 310 via an adhesive layer 320, and therefore the second chips 250 are not electrically connected to the wafer 310, as shown in FIG. 3C. In some embodiments, a thinning process is performed on the wafer 310 before the second chips 250 are bonded. For example, the substrate 160 is thinned from the non-active surface of the wafer 310, so as to reduce the thickness of the substrate 160.

After the second chips 250 are bonded, the substrate 160 and the insulating layer 170 of the wafer 310 are cut along the scribe lines, so as to form individual first chips 150. One or more second chips 250 may be stacked on the non-active surface of each first chip 150, in which the first chip 150 is not yet electrically connected to the second chip 250.

Figure 3D:
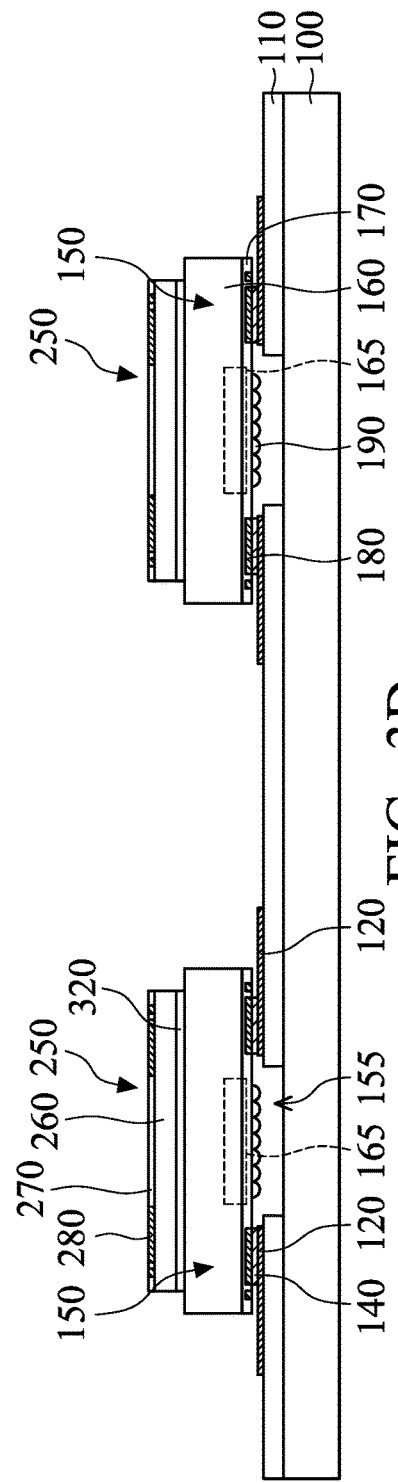

Referring to FIG. 3D, the stacks of the first chip 150 and the second chip 250 are bonded onto the redistribution layer 120 through first bonding structures 140 using the same or a similar method as that shown in FIG. 1C. In some embodiments, the first bonding structures 140 are interposed between the redistribution layer 120 and the conductive pads 180 of the first chips 150. In some embodiments, the size (e.g., the width) of the second chip 250 is less than the size of the first chip 150, and therefore a portion of the non-active surface of the first chip 150 is exposed, as shown in FIG. 3D.

Referring to FIG. 3E, a molding layer 200 is formed on the spacer layer 110 and the redistribution layer 120 using the same or a similar method as that shown in FIG. 1D. In some embodiments, the molding layer 200 surrounds the first chips 150, the adhesive layers 320, and the second chips 250. In some embodiments, the molding layer 200 cover the active surface of the second chips 250 and the conductive pads adjacent to the active surface. In some embodiments, the molding layer 200 is in direct contact with the adhesive layers 320 and the non-active surface of the first chips 150.

Referring to FIG. 3F, openings 125 (which are also referred to as first openings) are formed in the molding layer 200, in which the openings 125 partially expose the redistribution layer 120. Moreover, openings 285 (which are also referred to as second openings) are formed in the molding layer 200 and partially expose the active surface of the second chips 250, so that the conductive pads 280 are exposed from the openings 285. In some embodiments, the size (e.g., the depth) of the opening 125 is greater than the size of the opening 285. In some embodiments, a laser drilling process is performed in the molding layer 200, so as to form the openings 125 and the openings 285. The openings 125 and the openings 285 may be formed in different laser drilling processes and the order for forming the openings 125 and the openings 285 is not be limited.

Referring to FIG. 3G, a patterned redistribution layer 220 is formed on the molding layer 200. The redistribution layer 220 on the molding layer 200 extends into the openings 125 of the molding layer 200 and is electrically and physically connected to the redistribution layer 120 through the openings 125. Moreover, the redistribution layer 220 also extends into the openings 285 of the molding layer 200 and is electrically and physically connected to the conductive pads 285 of the second chips 250 through the openings 285. In some embodiments, the redistribution layer 220 is in direct contact with the molding layer 200.

Referring to FIG. 3H, a protective layer 230 is formed on the molding layer 200 using the same or a similar method as that shown in FIG. 1H, so as to cover the redistribution layer 220. In some embodiments, there is no insulating layer between the protective layer 230 and the molding layer 200, and the protective layer 230 is in direct contact with the molding layer 200.

In some embodiments, the redistribution layer 220 and the protective layer 230 completely fill the openings 285 together. In some embodiments, the protective layer 230 partially fills the openings 125, forming a hole 126 that is surrounded by the redistribution layer 220 and the protective layer 230 within each opening 125. As a result, the hole 126 can be a buffer between the protective layer 230 and the redistribution layer 220 in thermal cycles induced in subsequent processes. Undesirable stress, which is induced between the redistribution layer 220 and the protective layer 230 as a result of mismatched thermal expansion coefficients, is reduced. The redistribution layer 220 is prevented from being excessively pulled by the protective layer 230 when external temperature or pressure dramatically changes. As a result, peeling or disconnection problems of the redistribution layer 220 are avoidable.

Figure 3I:
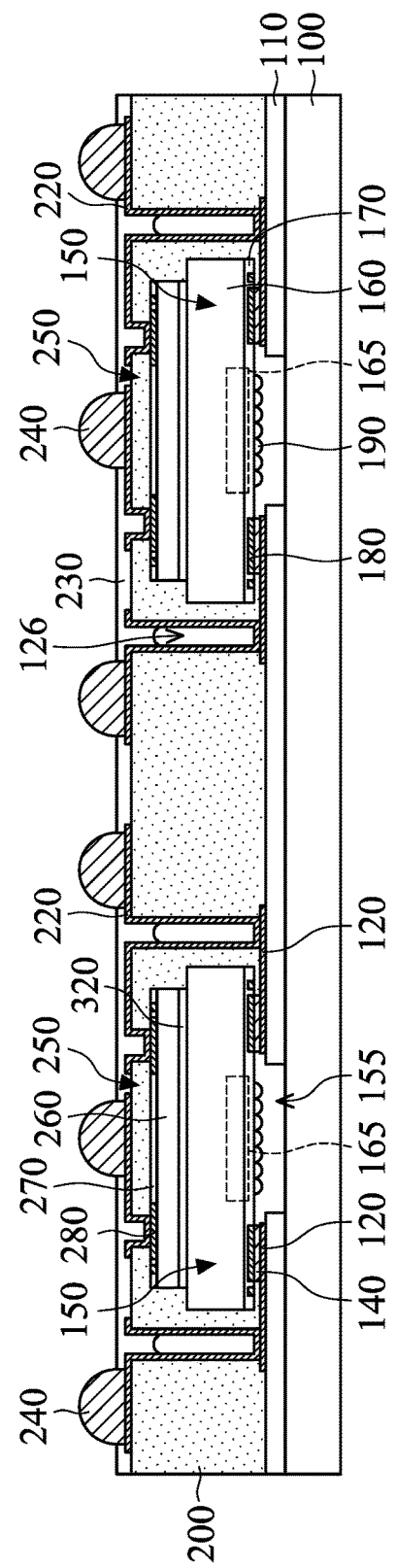

Next, as shown in FIG. 3H, openings 235 are formed in the protective layer 230 using the same or a similar method as that shown in FIG. 1H, so as to expose portions of the redistribution layer 220. Afterwards, as shown in FIG. 3I, conductive structures 240 are formed on the exposed redistribution layer 220 in the openings 235 using the same or a similar method as that shown in FIG. H. The conductive structures 240 are electrically connected to the first chips 150 through the redistribution layer 220, the redistribution layer 120, and the first bonding structures 140.

Figure 3J:
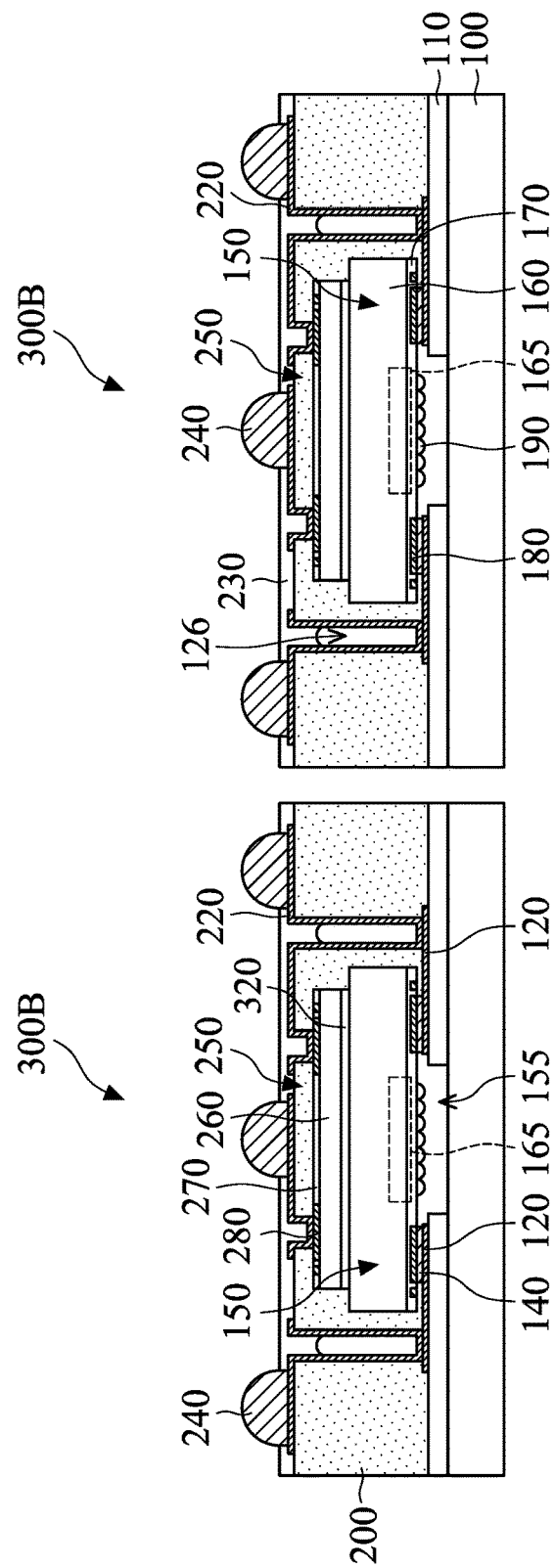

Referring to FIG. 3J, the protective layer 230, the molding layer 200, the spacer layer 110 and the cover plate 100 are cut along the scribe lines using the same or a similar method as that shown in FIG. 1J, so as to form individual chip packages 300B. In some other embodiments, the first chip 150 is a fingerprint sensor chip and the cover plate 100 is merely a temporary carrier. Accordingly, the formed chip package 300B does not include the cover plate 100 and the spacer layer 110.

The chip package 300B is similar to the chip package 300A. Each chip package 300B includes one first chip 150 and one second chip 250 that have different functionalities, as shown in FIG. 3J. However, embodiments of the present disclosure include various aspects. The chip package 300B includes one first chip 150 and multiple second chips 250 that have different functionalities.

FIGS. 4A to 4I illustrate a chip package and a method for forming the same according to some embodiments of the invention, in which FIGS. 4A to 4I are cross-sectional views of a method for forming a chip package according to some embodiments of the invention. Elements in FIGS. 4A to 4I that are the same as those in FIGS. 1A to 1J or FIGS. 3A to 3J are labeled with the same reference numbers as in FIGS. 1A to 1J or FIGS. 3A to 3J and may be not described again for brevity.

Figure 4A:
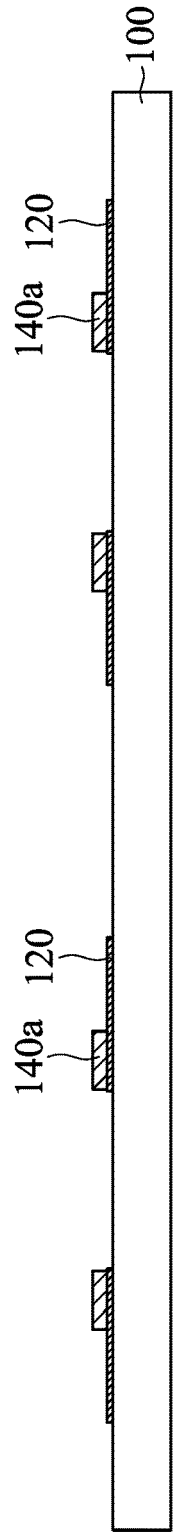

Referring to FIG. 4A, a cover plate 100 is provided. Afterwards, in some embodiments, a patterned redistribution layer (RDL) 120 (which is also referred to as a first redistribution layer) is formed on the cover plate 100. Afterwards, in some embodiments, first bonding structures 140a are formed on the redistribution layer 120. In some embodiments, the first bonding structures 140a are in direct contact with the redistribution layer 120 and a portion of the redistribution layer 120 is interposed between the first bonding structures 140a and the cover plate 100. In some embodiments, the first bonding structures 140a may be the same as or similar to the conductive structures 130 shown in FIG. 1B. For example, the first bonding structures 140a include pillars, bumps or other suitable conductive structures. In some embodiments, the first bonding structures 140a include copper, copper alloy, titanium, titanium alloy, combinations thereof, and other suitable materials. The first bonding structures 140a may be formed on the redistribution layer 120 using the same or a similar method for the formation of the conductive structures 130 shown in FIG. 1B.

Figure 4B:
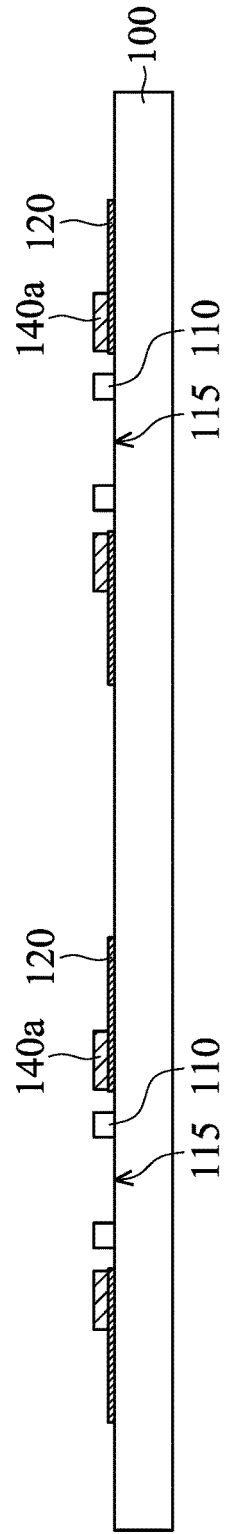

Afterwards, in some embodiments, a spacer layer (or dam) 110 with openings 115 is also formed on the cover plate 100 using the same or a similar method as that shown in FIG. 1A, as shown in FIG. 4B, so that the spacer layer 110 is surrounded by the first bonding structures 140a. The spacer layer 110 shown in FIG. 4B are not formed on the redistribution layer 120 (as shown in FIG. 1B). In some embodiments, the spacer layer 110 and the redistribution layer 120 are located at the same level.

Figure 4C:
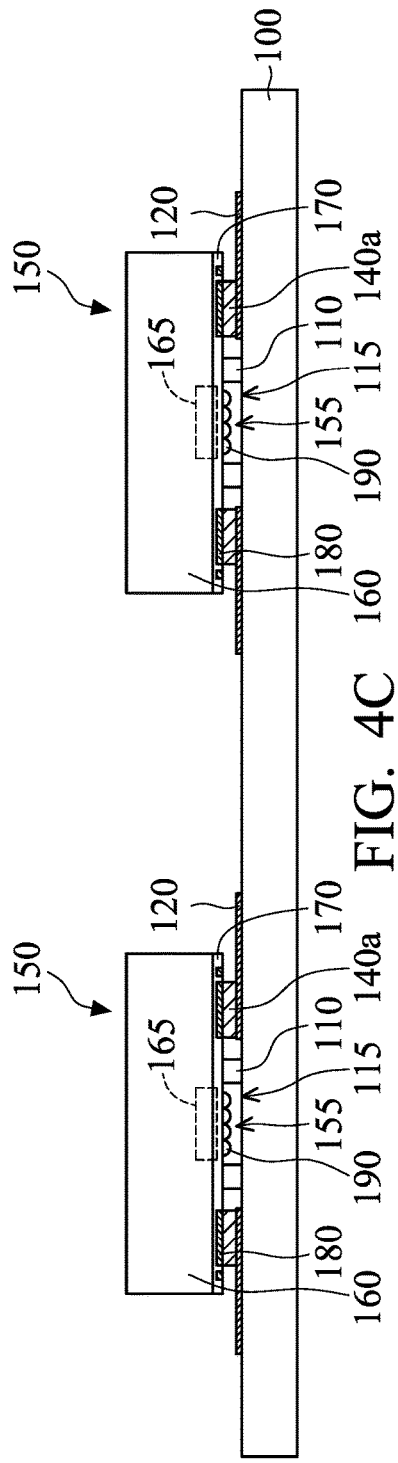

Referring to FIG. 4C, first chips 150 are bonded onto the redistribution layer 120 through first bonding structures 140a and onto the cover plate 100 through the spacer layer 110. In some embodiments, the first chips 150 are bonded onto the redistribution layer 120 and the cover plate 100 using the same or a similar method as that shown in FIG. 1C. After the first chips 150 are bonded onto the redistribution layer 120, a cavity 155 is formed between the active surface of each first chip 150 and the cover plate 100 and surrounded by the spacer layer 110 below the corresponding first chip 150. The cavity 155 also corresponds to the sensing region 165 of each first chip 150, so that the optical component 190 is located in the corresponding cavity 155 and is protected by the cover plate 100.

Figure 4D:
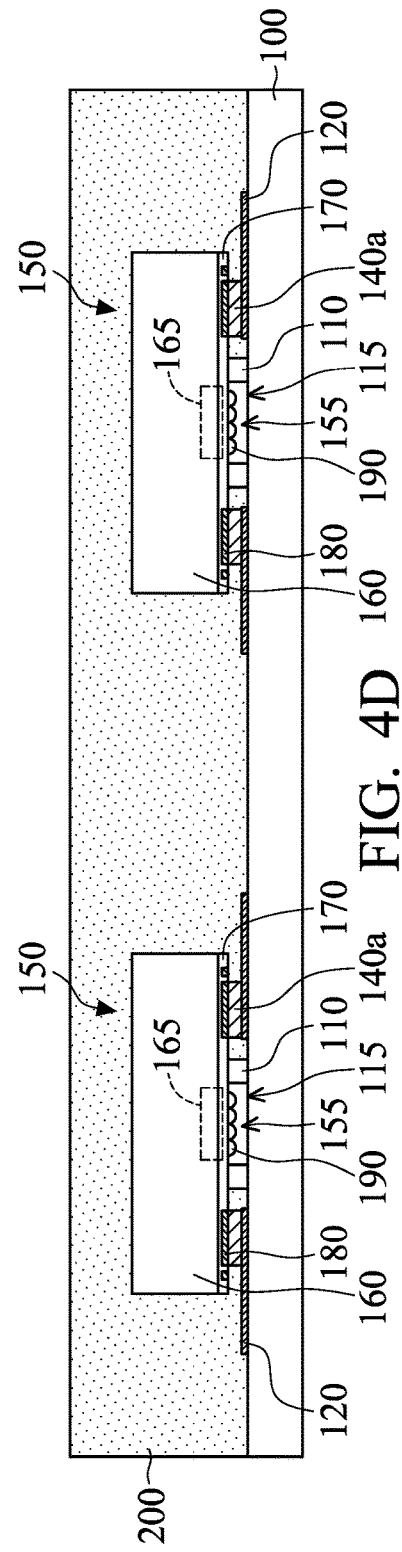

Referring to FIG. 4D, a molding layer 200 is formed on the cover plate 100 using the same or a similar method as that shown in FIG. 1D. In some embodiments, the molding layer 200 surrounds the redistribution layer 120 and the first chips 150. In some embodiments, the molding layer 200 is in direct contact with the spacer layer 110, the redistribution layer 120, the first bonding structures 140a, and the first chips 150. In some embodiments, the molding layer 200 covers the non-active surface of each first chip 150 (i.e., the rear surface of the substrate 160).

Referring to FIG. 4E, openings 125 are formed in the molding layer 200 by the same or a similar method as that shown in FIG. 3F, in which the openings 125 partially expose the redistribution layer 120. Afterwards, in some embodiments, a patterned redistribution layer 220 (which is also referred to as a second redistribution layer) is formed on the molding layer 200 by the same or a similar method as that shown in FIG. 3G, as shown in FIG. 4F. The redistribution layer 220 on the molding layer 200 extends into the openings 125 of the molding layer 200 and is electrically and physically connected to the redistribution layer 120 through the openings 125. In some embodiments, the redistribution layer 220 is in direct contact with the molding layer 200.

Referring to FIG. 4G, a protective layer 230 is formed on the molding layer 200, so as to cover the redistribution layer 220. Next, openings 235 and openings 236 are formed in the protective layer 230, so as to expose portions of the redistribution layer 220. In some embodiments, the protective layer 230 and the openings 235 and 236 are formed using the same or a similar method as that shown in FIG. 1H. As shown in FIG. 4G, openings 235 may overlap the molding layer 200 and openings 236 may overlap the first chip 150, as viewed from a top-view perspective. In some embodiments, the size (e.g., width) of the opening 235 is greater than that of the opening 236. In some embodiments, there is no insulating layer between the protective layer 230 and the molding layer 200, and the protective layer 230 is in direct contact with the molding layer 200.

In some embodiments, the protective layer 230 partially fills the openings 125, forming a hole 126 that is surrounded by the redistribution layer 220 and the protective layer 230 within each opening 125, as shown in FIG. 4G.

Referring to FIG. 4H, the same or a similar method as that shown in FIG. 1I is performed, so that second chips 250 are bonded onto the redistribution layer 220 through second bonding structures 290 (which completely fill the openings 236) and conductive structures 240 are formed on the exposed redistribution layer 220 in the openings 235.

Figure 4I:
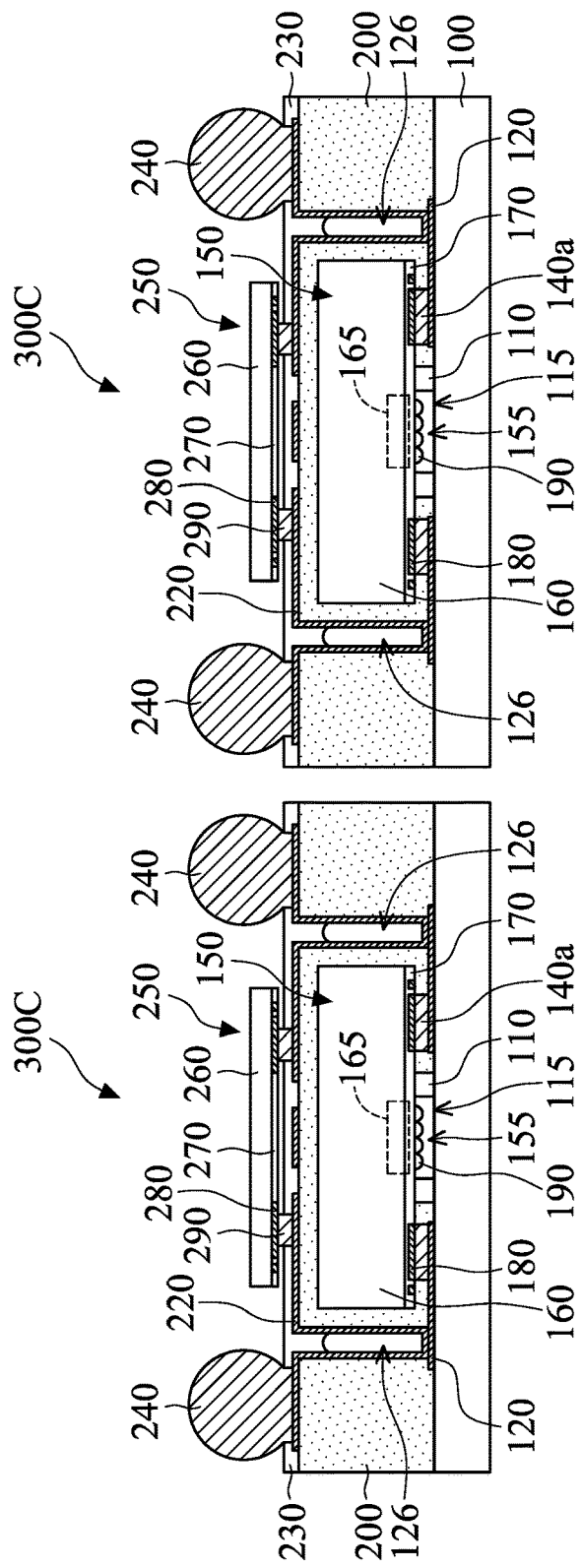

Referring to FIG. 4I, the protective layer 230, the molding layer 200 and the cover plate 100 are cut along the scribe lines using the same or a similar method as that shown in FIG. 1J, so as to form individual chip packages 300C. In some other embodiments, the first chip 150 is a fingerprint sensor chip and the cover plate 100 is merely a temporary carrier. Accordingly, the formed chip package 300C does not include the cover plate 100 and the spacer layer 110.

The chip package 300C is similar to chip packages 300A and 300B. Each chip package 300C includes one first chip 150 and one second chip 250 that have different functionalities, as shown in FIG. 4I. However, embodiments of the present disclosure include various aspects. The chip package 300C includes one first chip 150 and multiple second chips 250 that have different functionalities.

FIGS. 5A to 5H illustrate a chip package and a method for forming the same according to some embodiments of the invention, in which FIGS. 5A to 5H are cross-sectional views of a method for forming a chip package according to some embodiments of the invention. Elements in FIGS. 5A to 5H that are the same as those in FIGS. 1A to 1J, FIGS. 3A to 3J, or FIGS. 4A to 4I are labeled with the same reference numbers as in FIGS. 1A to 1J, FIGS. 3A to 3J, or FIGS. 4A to 4I and may be not described again for brevity.

Referring to FIG. 5A, the structure as shown in FIG. 4C is provided. Namely, a patterned redistribution layer (RDL) 120 (which is also referred to as a first redistribution layer) having first bonding structures 140a thereon, a spacer layer 110 having openings 115 are formed on a cover plate 100. Next, first chips 150 are bonded onto the redistribution layer 120 through first bonding structures 140 and onto the cover plate 100 through the spacer layer 110.

Referring to FIG. 5B, second chips 250a are correspondingly bonded onto the first chips 150 through an adhesive layer 320 using the same or a similar method as that shown in FIG. 3D. As a result, the non-active surface of each second chip 250a faces the non-active surface of the corresponding first chip 150, and therefore the second chips 250a are not electrically connected to the wafer 310. The second chip 250a is similar to the second chip 250 shown in FIG. 3C. In particular, the second chip 250a includes a substrate 260, an insulating layer 270, and conductive pads 280. Unlike the second chip 250 shown in FIG. 3C, the second chip 250a further includes at least one second bonding structure 290 formed on the corresponding conductive pad 280. In some embodiments, the second bonding structure 290 is the same as or similar to the first bonding structures 140a. Alternatively, the second bonding structure 290 is the same as or similar to the first bonding structures 140 shown in FIG. 1C.

One or more second chips 250a may be stacked on the non-active surface of each first chip 150, in which the first chip 150 is not yet electrically connected to the second chip 250a. In some embodiments, the size (e.g., the width) of the second chip 250a is less than the size of the first chip 150, and therefore a portion of the non-active surface of the first chip 150 is exposed.

Referring to FIG. 5C, a molding layer 200 is formed on the cover plate 100 using the same or a similar method as that shown in FIG. 3E. In some embodiments, the molding layer 200 surrounds the first chips 150, the adhesive layers 320, and the second chips 250a. In some embodiments, the molding layer 200 covers the active surface of the second chips 250a and the conductive pads 280 adjacent to the active surface. In some embodiments, the molding layer 200 is in direct contact with the adhesive layers 320 and the non-active surface of each first chip 150 (i.e., the rear surface of the substrate 160). In some embodiments, the molding layer 200 is in direct contact with the spacer layer 110, the redistribution layer 120 and the first bonding structures 140a.

Referring to FIG. 5D, a thinning process is performed on the molding layer 200 until the second bonding structure 290 is exposed. The thinning process may include a polishing process, a grinding process, a milling process or another suitable process. Afterwards, openings 125 are formed in the molding layer 200 using the same or a similar method as that shown in 3F, in which the openings 125 partially expose the redistribution layer 120.

Afterwards, in some embodiments, a patterned redistribution layer 220 is formed on the molding layer 200 using the same or a similar method as that shown in FIG. 3G, as shown in FIG. 5E. The redistribution layer 220 on the molding layer 200 extends into the openings 125 of the molding layer 200 and is electrically and physically connected to the redistribution layer 120 through the openings 125. In some embodiments, the redistribution layer 220 is in direct contact with the molding layer 200 and the exposed second bonding structure 290, so that the redistribution layer 220 is electrically connected to the second chips 250.

Referring to FIG. 5F, a protective layer 230 is formed on the molding layer 200, so as to cover the redistribution layer 220. Next, openings 235 are formed in the protective layer 230, so as to expose portions of the redistribution layer 220. In some embodiments, the protective layer 230 and the openings 235 are formed by the same or a similar method as that shown in FIG. 1H. In some embodiments, there is no insulating layer between the protective layer 230 and the molding layer 200, and the protective layer 230 is in direct contact with the molding layer 200.

Figure 5G:
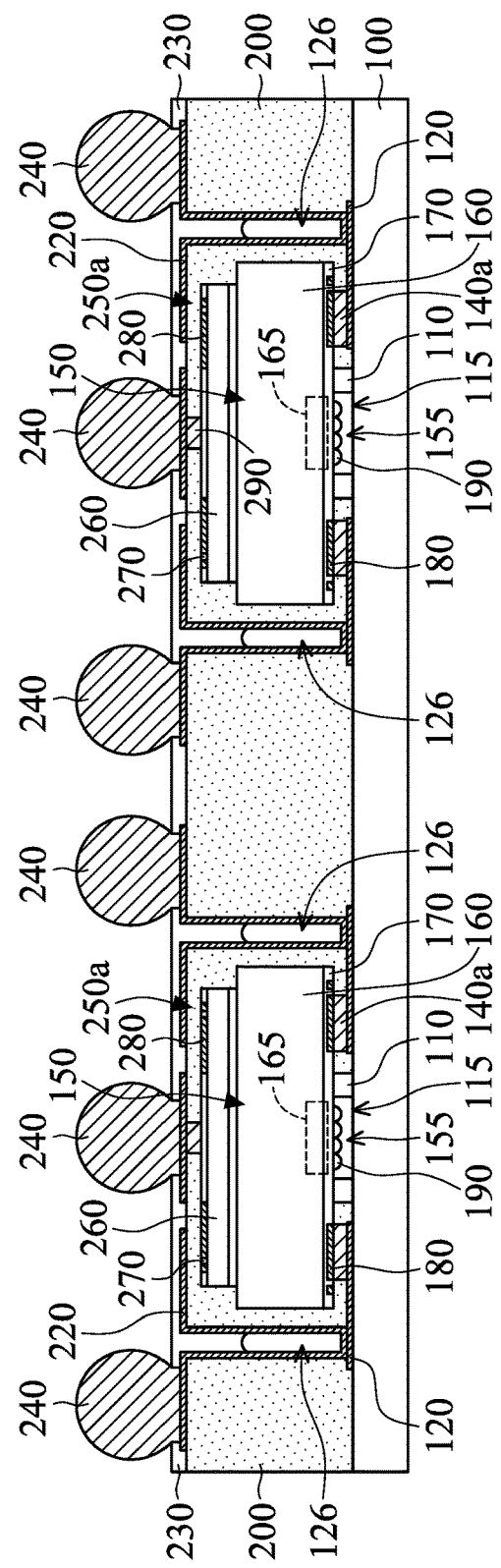

In some embodiments, the protective layer 230 partially fills the openings 125, forming a hole 126 that is surrounded by the redistribution layer 220 and the protective layer 230 within each opening 125, as shown in FIG. 5F. Afterwards, in some embodiments, the same or a similar method as that shown in FIG. 1I is performed, so that conductive structures 240 are formed on the exposed redistribution layer 220 in the openings 235, as shown in FIG. 5G. The conductive structures 240 are electrically connected to the first chips 150 through the redistribution layer 220, the redistribution layer 120, and the first bonding structures 140a.

Figure 5H:
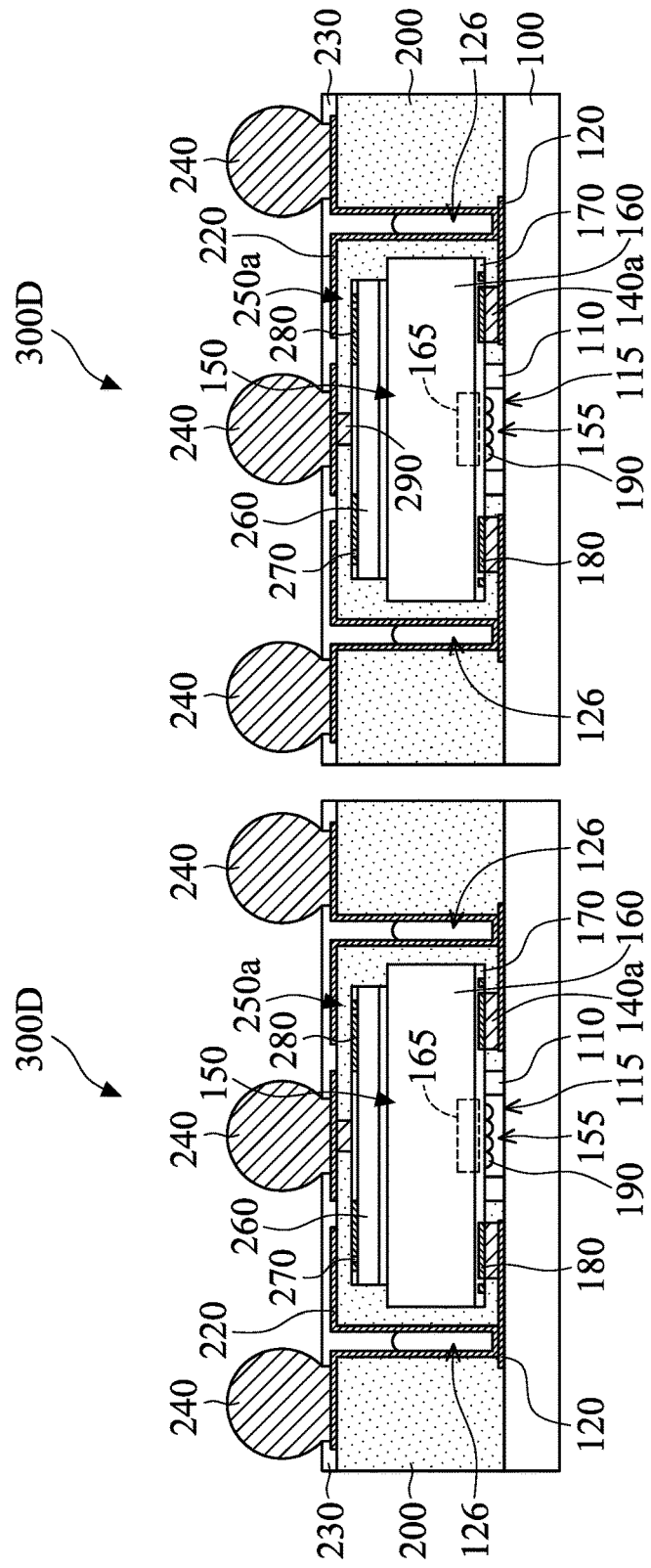

Referring to FIG. 5H, the protective layer 230, the molding layer 200 and the cover plate 100 are cut along the scribe lines by the same or a similar method as that shown in FIG. 1J, so as to form individual chip packages 300D. In some other embodiments, the first chip 150 is a fingerprint sensor chip and the cover plate 100 is merely a temporary carrier. Accordingly, the formed chip package 300D does not include the cover plate 100 and the spacer layer 110.

The chip package 300D is similar to the chip packages 300A, 300B and 300C. Each chip package 300D includes one first chip 150 and one second chip 250 that have different functionalities, as shown in FIG. 5H. However, embodiments of the present disclosure include various aspects. The chip package 300D includes one first chip 150 and multiple second chips 250 that have different functionalities.

The chip packages 300B, 300C and 300D have advantages that are the same as or similar to those of the chip package 300A. More specifically, the first chip 150 and the second chip 250 are electrically connected to each other through the first bonding structures 140 or 140a, the redistribution layer 120, and the redistribution layer 220 in and on the molding layer 200, and therefore there is no need to employ the through-silicon via technology. Namely, the process steps can be simplified, the manufacture time can be reduced, and the manufacture cost can be greatly reduced.

The electrical connection path between the first chip 150 and the second chip 250 is formed by the redistribution layer 220 outside of the first chip 150. Moreover, the molding layer 200 with an adequate thickness is between the redistribution layer 220 and the first chip 150. Therefore, leakage can be reduced or eliminated.

Since the first chip 150 and the second chip 250 in the chip package 300B or 300D are encapsulated by the molding layer 200, the structure strength of the chip package 300B or 300D can be increased further. Accordingly, when a reliability test is performed on the chip package 300B, the first chip 150 and the second chip 250 can be protected by the molding layer 200, thereby increasing the device performance and reliability of the chip package 300B. Moreover, since the structure strength is increased due to encapsulation of the first chip 150 and the second chip 250 in the chip package 300B or 300D via the molding layer 200, crack or other structural problems would not occur. Therefore, the sizes (e.g., the thickness) of the first chip 150 and the second chip 250 that are protected by the molding layer 200 can be reduced further. As a result, the chip package 300B or 300D may have a smaller size, and the sizes of the subsequently bonded circuit board and the formed electronic product are also reduced further. In other words, the size of the first chip 150 and the second chip 250 can be controlled via the molding layer 200, so that the design flexibility for the size of the chip package 300B or 300D is increased.

In addition, based on the demands, the chip packages 300A, 300B, 300C and 300D in the embodiments of the present disclosure may be employed to package chips with different functionalities and the number of chips is not limited. A suitable size for the cover plate 100 is determined according to the desired number of chips and the desired size of the chips, so as to facilitate the wafer-level packaging process, thereby increasing process efficiency.

According to the aforementioned embodiments of the invention, the chip stacking technology is employed to fabricate a chip package with multiple functionalities and a small size. The problems induced by the use of through-silicon via technology can be addressed. In particular, the process can be simplified, the manufacturing cost can be reduced, and the performance and reliability of the chip package using SiP technology can be increased further.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a first redistribution layer;
   a first bonding structure, wherein the first bonding structure is on the first redistribution layer;
   a first chip, wherein the first chip comprises a sensing region, a first insulating layer, and a conductive pad disposed in the first insulating layer, which are adjacent to an active surface, and wherein the first chip is bonded onto the first redistribution layer through the first bonding structure, and the first bonding structure is disposed between the conductive pad and the first redistribution layer;
   an optical component disposed directly on the first insulating layer;
   a molding layer, wherein the molding layer covers the first redistribution layer and surrounds the first chip;
   a second redistribution layer, wherein the second redistribution layer is disposed on the molding layer and the first chip, and the second redistribution layer is electrically connected to the first redistribution layer; and
a second chip, wherein the second chip is stacked on a non-active surface of the first chip, and the second chip is electrically connected to the first chip through the second redistribution layer, the first redistribution layer, and the first bonding structure.

2. The chip package as claimed in claim 1, wherein the first chip has the function of sensing images or biometrics and the second chip does not have the function of sensing images.

3. The chip package as claimed in claim 1, further comprising:
a cover plate, wherein the cover plate comprises a transparent material, and wherein the active surface of the first chip faces the cover plate, and the first redistribution layer and the first bonding structure are disposed between the cover plate and the active surface of the first chip.

4. The chip package as claimed in claim 3, further comprising:
a spacer layer, wherein the spacer layer is disposed between the cover plate and the first redistribution layer, and forms a cavity corresponding to the sensing region and between the active surface of the first chip and the cover plate, and wherein the optical component is disposed on the active surface of the first chip and the optical component corresponds to the cavity.

5. The chip package as claimed in claim 3, further comprising:
a spacer layer, wherein the first redistribution layer is disposed between the spacer layer and the first bonding structure, and the spacer layer is in direct contact with the cover plate, the molding layer, and the first redistribution layer.

6. The chip package as claimed in claim 3, further comprising:
a spacer layer, wherein the spacer layer is disposed on the cover plate below the first chip and is surrounded by the first bonding structure, and the spacer layer forms a cavity corresponding to the sensing region and between the active surface of the first chip and the cover plate, and wherein the optical component is disposed on the active surface of the first chip and the optical component corresponds to the cavity.

7. The chip package as claimed in claim 1, further comprising:
a protective layer, wherein the protective layer is disposed on the molding layer and the non-active surface of the first chip, and the protective layer covers the second redistribution layer; and
a plurality of conductive structures, wherein the plurality of conductive structures is disposed on the second redistribution layer, and the protective layer partially surrounds the plurality of conductive structures.

8. The chip package as claimed in claim 7, further comprising:
a second bonding structure, wherein the second chip is bonded onto the second redistribution layer through the second bonding structure, and wherein the protective layer surrounds the second bonding structure and the plurality of conductive structures.

9. The chip package as claimed in claim 8, wherein the second bonding structure and the plurality of conductive structures are located at the same level, and wherein the second chip has a thickness that is less than that of the plurality of conductive structures.

10. The chip package as claimed in claim 7, wherein the second chip comprises a second bonding structure, wherein the second chip is electrically connected to the second redistribution layer through the second bonding structure, and wherein the molding layer surrounds the second bonding structure and the protective layer surrounds the plurality of conductive structures.

11. The chip package as claimed in claim 7, wherein the molding layer surrounds the second chip, and wherein the protective layer and the plurality of conductive structures are disposed on the molding layer, the first chip, and the second chip.

12. The chip package as claimed in claim 7, wherein the protective layer and the second redistribution layer on the molding layer extend into the molding layer, and wherein a hole is formed that is surrounded by the protective layer and the second redistribution layer in the molding layer.

13. The chip package as claimed in claim 1, wherein the second chip has a width that is less than that of the first chip.

14. The chip package as claimed in claim 1, further comprising:
a conductive structure, wherein the conductive structure is disposed on the first redistribution layer and is surrounded by the molding layer, wherein the second redistribution layer on the molding layer is electrically connected to the first redistribution layer that is covered with the molding layer, through the conductive structure, and wherein the conductive structure is made of a material that is different from that of the first bonding structure.

15. The chip package as claimed in claim 14, further comprising:
a second insulating layer, wherein the second insulating layer is disposed on the molding layer and between the first chip and the second chip, and wherein the second insulating layer is interposed between the non-active surface of the first chip and the second redistribution layer.

16. The chip package as claimed in claim 1, further comprising:
an adhesive layer, wherein the second chip is attached onto the non-surface of the first chip through the adhesive layer, and wherein the molding layer surrounds the second chip and the adhesive layer.

17. The chip package as claimed in claim 1, further comprising:
a third chip, wherein the second chip and the third chip are stacked on the non-active surface of the first chip and overlap the sensing region of the first chip.

18. A method for forming a chip package, comprising:
forming a first redistribution layer;
forming a first bonding structure on the first redistribution layer;
bonding a first chip onto the first redistribution layer through the first bonding structure, wherein the first chip comprises a sensing region, an insulating layer, and a conductive pad disposed in the insulating layer, which are adjacent to an active surface, and wherein the first bonding structure is disposed between the conductive pad and the first redistribution layer;
forming an optical component directly on the insulating layer;
forming a molding layer to cover the first redistribution layer and surround the first chip;

forming a second redistribution layer on the molding layer and the first chip, wherein the second redistribution layer is electrically connected to the first redistribution layer; and stacking a second chip, wherein the second chip is stacked on a non-active surface of the first chip, and the second chip is electrically connected to the first chip through the second redistribution layer, the first redistribution layer and the first bonding structure.

19. The method for forming a chip package as claimed in claim 18, further comprising:

providing a cover plate; and forming a spacer layer on the cover plate.

20. The method for forming a chip package as claimed in claim 19, wherein the first redistribution layer is formed on the spacer layer before the first chip is bonded.

\* \* \* \* \*